(12) United States Patent
Komai

(10) Patent No.: US 11,037,634 B2
(45) Date of Patent: Jun. 15, 2021

(54) SEMICONDUCTOR STORAGE DEVICE HAVING A GROUP ADJACENT BIT LINES CONNECTED TO SENSE CIRCUITS THAT ARE EACH CONNECTED TO A DIFFERENT DATA BUS

(71) Applicant: Toshiba Memory Corporation, Tokyo (JP)

(72) Inventor: Hiromitsu Komai, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/901,881

(22) Filed: Feb. 21, 2018

(65) Prior Publication Data
US 2019/0057746 A1   Feb. 21, 2019

(30) Foreign Application Priority Data

Aug. 17, 2017 (JP) .............................. JP2017-157575

(51) Int. Cl.
| | |
|---|---|
| *G11C 16/24* | (2006.01) |
| *G11C 16/26* | (2006.01) |
| *G11C 16/08* | (2006.01) |
| *G11C 7/18* | (2006.01) |
| *G11C 7/10* | (2006.01) |
| *G11C 5/02* | (2006.01) |
| G11C 16/04 | (2006.01) |
| H01L 27/11582 | (2017.01) |
| H01L 27/1157 | (2017.01) |
| G11C 11/56 | (2006.01) |

(52) U.S. Cl.
CPC .............. *G11C 16/26* (2013.01); *G11C 5/025* (2013.01); *G11C 7/1063* (2013.01); *G11C 7/18* (2013.01); *G11C 16/08* (2013.01); *G11C 16/24* (2013.01); *G11C 11/5671* (2013.01); *G11C 16/0483* (2013.01); *H01L 27/1157* (2013.01); *H01L 27/11582* (2013.01)

(58) Field of Classification Search
CPC ..... G11C 16/26; G11C 16/0483; G11C 16/08; G11C 7/1051
USPC ..................................................... 365/185.11
See application file for complete search history.

(56) References Cited

U.S. PATENT DOCUMENTS

| | | |
|---|---|---|
| 5,815,444 A | 9/1998 | Ohta |
| 6,891,753 B2 | 5/2005 | Cernea |
| 7,788,619 B2 | 8/2010 | Sim |
| 8,243,491 B2 * | 8/2012 | Hisada ............... G11C 16/0483 365/72 |

(Continued)

*Primary Examiner* — Alfredo Bermudez Lozada
(74) *Attorney, Agent, or Firm* — Kim & Stewart LLP

(57) ABSTRACT

A semiconductor storage device includes a plurality of memory cells, bit lines respectively connected to the third memory cells, sense circuits respectively connected to the bit lines, latch circuits respectively connected to the sense circuits, and an input and output circuit connected to a first set of latch circuits via a first data line, a second set of latch circuit via a second data line, and a third set of latch circuits via a third data line. The bit lines are disposed in sequence in a first direction and a group of the sense circuits is disposed in sequence in a second direction crossing the first direction, and two bit lines that are not adjacent in the first direction are connected respectively to two sense circuits in the group that are adjacent in the second direction.

13 Claims, 20 Drawing Sheets

(56) References Cited

U.S. PATENT DOCUMENTS

| | | | |
|---|---|---|---|
| 9,111,592 B2 | 8/2015 | Maejima | |
| 2008/0165559 A1 | 7/2008 | Kim et al. | |
| 2014/0071763 A1* | 3/2014 | Shikata | G11C 16/0483 365/185.18 |
| 2014/0173182 A1* | 6/2014 | Komai | G06F 3/0646 711/103 |
| 2014/0211566 A1* | 7/2014 | Kono | G11C 16/26 365/185.05 |

* cited by examiner

STORE DATA AT LEADING COLUMN

FIG. 15

| BL | | SAL | SAU | | XDL | | IO | |
|---|---|---|---|---|---|---|---|---|
| 0 | D0 | 0 | 0 | D0 | 0 | D0 | 0 | D0 |
| 1 | D1 | 8 | 1 | D1 | 1 | D1 | 1 | D1 |
| 2 | D2 | 16 | 2 | D2 | 2 | D2 | 2 | D2 |
| 3 | D3 | 24 | 3 | D3 | 3 | D3 | 3 | D3 |
| 4 | D4 | 32 | 4 | D4 | 4 | D4 | 4 | D4 |
| 5 | D5 | 40 | 5 | D5 | 5 | D5 | 5 | D5 |
| 6 | D6 | 48 | 6 | D6 | 6 | D6 | 6 | D6 |
| 7 | D7 | 56 | 7 | D7 | 7 | D7 | 7 | D7 |
| 8 | D8 | 1 | 8 | D8 | 8 | D8 | | |
| 9 | D9 | 9 | 9 | D9 | 9 | D9 | | |
| 10 | D10 | 17 | 10 | D10 | 10 | D10 | | |
| 11 | D11 | 25 | 11 | D11 | 11 | D11 | | |
| 12 | D12 | 33 | 12 | D12 | 12 | D12 | | |
| 13 | D13 | 41 | 13 | D13 | 13 | D13 | | |
| 14 | D14 | 49 | 14 | D14 | 14 | D14 | | |
| 15 | D15 | 57 | 15 | D15 | 15 | D15 | | |
| 16 | D16 | 2 | 16 | D16 | 16 | D16 | | |
| 17 | D17 | 10 | 17 | D17 | 17 | D17 | | |
| 18 | D18 | 18 | 18 | D18 | 18 | D18 | | |
| 19 | D19 | 26 | 19 | D19 | 19 | D19 | | |
| 20 | D20 | 34 | 20 | D20 | 20 | D20 | | |
| 21 | D21 | 42 | 21 | D21 | 21 | D21 | | |
| 22 | D22 | 50 | 22 | D22 | 22 | D22 | | |
| 23 | D23 | 58 | 23 | D23 | 23 | D23 | | |
| ⋮ | ⋮ | ⋮ | ⋮ | ⋮ | ⋮ | | | |
| 56 | D56 | 7 | 56 | D56 | 56 | | | |
| 57 | D57 | 15 | 57 | D57 | 57 | | | |
| 58 | D58 | 23 | 58 | D58 | 58 | | | |
| 59 | D59 | 31 | 59 | D59 | 59 | | | |
| 60 | D60 | 39 | 60 | D60 | 60 | | | |
| 61 | D61 | 47 | 61 | D61 | 61 | | | |
| 62 | D62 | 55 | 62 | D62 | 62 | | | |
| 63 | D63 | 63 | 63 | D63 | 63 | | | |

OUTPUT DATA AT LEADING COLUMN

STORE DATA AT SECOND TO FIFTH COLUMNS

FIG. 16

| BL | | SAL | SAU | | XDL | |
|---|---|---|---|---|---|---|
| 0 | D0 | 0 | 0 | D0 | 0 | D0 |
| 1 | D1 | 8 | 1 | D1 | 1 | D1 |
| 2 | D2 | 16 | 2 | D2 | 2 | D2 |
| 3 | D3 | 24 | 3 | D3 | 3 | D3 |
| 4 | D4 | 32 | 4 | D4 | 4 | D4 |
| 5 | D5 | 40 | 5 | D5 | 5 | D5 |
| 6 | D6 | 48 | 6 | D6 | 6 | D6 |
| 7 | D7 | 56 | 7 | D7 | 7 | D7 |
| 8 | D8 | 1 | 8 | D8 | 8 | D8 |
| 9 | D9 | 9 | 9 | D9 | 9 | D9 |
| 10 | D10 | 17 | 10 | D10 | 10 | D10 |
| 11 | D11 | 25 | 11 | D11 | 11 | D11 |
| 12 | D12 | 33 | 12 | D12 | 12 | D12 |
| 13 | D13 | 41 | 13 | D13 | 13 | D13 |
| 14 | D14 | 49 | 14 | D14 | 14 | D14 |
| 15 | D15 | 57 | 15 | D15 | 15 | D15 |
| 16 | D16 | 2 | 16 | D16 | 16 | D16 |
| 17 | D17 | 10 | 17 | D17 | 17 | D17 |
| 18 | D18 | 18 | 18 | D18 | 18 | D18 |
| 19 | D19 | 26 | 19 | D19 | 19 | D19 |
| 20 | D20 | 34 | 20 | D20 | 20 | D20 |
| 21 | D21 | 42 | 21 | D21 | 21 | D21 |
| 22 | D22 | 50 | 22 | D22 | 22 | D22 |
| 23 | D23 | 58 | 23 | D23 | 23 | D23 |
| ⋮ | ⋮ | ⋮ | ⋮ | ⋮ | ⋮ | ⋮ |
| 56 | D56 | 7 | 56 | D56 | 56 | D56 |
| 57 | D57 | 15 | 57 | D57 | 57 | D57 |
| 58 | D58 | 23 | 58 | D58 | 58 | D58 |
| 59 | D59 | 31 | 59 | D59 | 59 | D59 |
| 60 | D60 | 39 | 60 | D60 | 60 | D60 |
| 61 | D61 | 47 | 61 | D61 | 61 | D61 |
| 62 | D62 | 55 | 62 | D62 | 62 | D62 |
| 63 | D63 | 63 | 63 | D63 | 63 | D63 |

STORE DATA AT SIXTH TO EIGHTH COLUMNS

| IO | |
|---|---|
| 0 | D8 |
| 1 | D9 |
| 2 | D10 |
| 3 | D11 |
| 4 | D12 |
| 5 | D13 |
| 6 | D14 |
| 7 | D15 |

OUTPUT DATA AT SECOND COLUMN

| BL | | SAL | SAU | | XDL | |
|---|---|---|---|---|---|---|
| 0 | D0 | 0 | 0 | D0 | 0 | D0 |
| 1 | D1 | 8 | 1 | D1 | 1 | D1 |
| 2 | D2 | 16 | 2 | D2 | 2 | D2 |
| 3 | D3 | 24 | 3 | D3 | 3 | D3 |
| 4 | D4 | 32 | 4 | D4 | 4 | D4 |
| 5 | D5 | 40 | 5 | D5 | 5 | D5 |
| 6 | D6 | 48 | 6 | D6 | 6 | D6 |
| 7 | D7 | 56 | 7 | D7 | 7 | D7 |
| 8 | D8 | 1 | 8 | D8 | 8 | D8 |
| 9 | D9 | 9 | 9 | D9 | 9 | D9 |
| 10 | D10 | 17 | 10 | D10 | 10 | D10 |
| 11 | D11 | 25 | 11 | D11 | 11 | D11 |
| 12 | D12 | 33 | 12 | D12 | 12 | D12 |
| 13 | D13 | 41 | 13 | D13 | 13 | D13 |
| 14 | D14 | 49 | 14 | D14 | 14 | D14 |
| 15 | D15 | 57 | 15 | D15 | 15 | D15 |
| 16 | D16 | 2 | 16 | D16 | 16 | D16 |
| 17 | D17 | 10 | 17 | D17 | 17 | D17 |
| 18 | D18 | 18 | 18 | D18 | 18 | D18 |
| 19 | D19 | 26 | 19 | D19 | 19 | D19 |
| 20 | D20 | 34 | 20 | D20 | 20 | D20 |
| 21 | D21 | 42 | 21 | D21 | 21 | D21 |
| 22 | D22 | 50 | 22 | D22 | 22 | D22 |
| 23 | D23 | 58 | 23 | D23 | 23 | D23 |
| ⋮ | ⋮ | ⋮ | ⋮ | ⋮ | ⋮ | ⋮ |
| 56 | D56 | 7 | 56 | D56 | 56 | D56 |
| 57 | D57 | 15 | 57 | D57 | 57 | D57 |
| 58 | D58 | 23 | 58 | D58 | 58 | D58 |
| 59 | D59 | 31 | 59 | D59 | 59 | D59 |
| 60 | D60 | 39 | 60 | D60 | 60 | D60 |
| 61 | D61 | 47 | 61 | D61 | 61 | D61 |
| 62 | D62 | 55 | 62 | D62 | 62 | D62 |
| 63 | D63 | 63 | 63 | D63 | 63 | D63 |

| IO | |
|---|---|
| 0 | D16 |
| 1 | D17 |
| 2 | D18 |
| 3 | D19 |
| 4 | D20 |
| 5 | D21 |
| 6 | D22 |
| 7 | D23 |

OUTPUT DATA AT THIRD COLUMN

FIG. 18

| DATA TRANSMISSION | COLUMN | BL0~63 | COLUMN | BL64~127 |
|---|---|---|---|---|
| 8 | 700 | XDL56~63 | 701 | XDL120~127 |
| 7 | 600 | XDL48~55 | 601 | XDL112~119 |
| 6 | 500 | XDL40~47 | 501 | XDL104~111 |
| 5 | 400 | XDL32~39 | 401 | XDL96~103 |
| 4 | 300 | XDL24~31 | 301 | XDL88~95 |
| 3 | 200 | XDL16~23 | 201 | XDL80~87 |
| 2 | 100 | XDL8~15 | 101 | XDL72~79 |
| 1 | 0 | XDL0~7 | 1 | XDL64~71 |

⋮

| COLUMN | BL6336~6399 |
|---|---|
| 799 | XDL6392~6399 |
| 699 | XDL6384~6391 |
| 599 | XDL6376~6383 |
| 499 | XDL6368~6375 |
| 399 | XDL6360~6367 |
| 299 | XDL6352~6359 |
| 199 | XDL6344~6351 |
| 99 | XDL6336~6343 |

SEMICONDUCTOR STORAGE DEVICE HAVING A GROUP ADJACENT BIT LINES CONNECTED TO SENSE CIRCUITS THAT ARE EACH CONNECTED TO A DIFFERENT DATA BUS

CROSS-REFERENCE TO RELATED APPLICATION

This application is based upon and claims the benefit of priority from Japanese Patent Application No. 2017-157575, filed Aug. 17, 2017, the entire contents of which are incorporated herein by reference.

FIELD

Embodiments described herein relate generally to a semiconductor storage device.

BACKGROUND

NAND flash memory is one example of a semiconductor storage device.

DESCRIPTION OF THE DRAWINGS

FIGS. 13-17 illustrate one example of transmission of data during the read operation in the semiconductor storage device according to the first embodiment.

FIG. 18 illustrates another example of transmission of data during the read operation in the semiconductor storage device according to the first embodiment.

DETAILED DESCRIPTION

Figure 1:
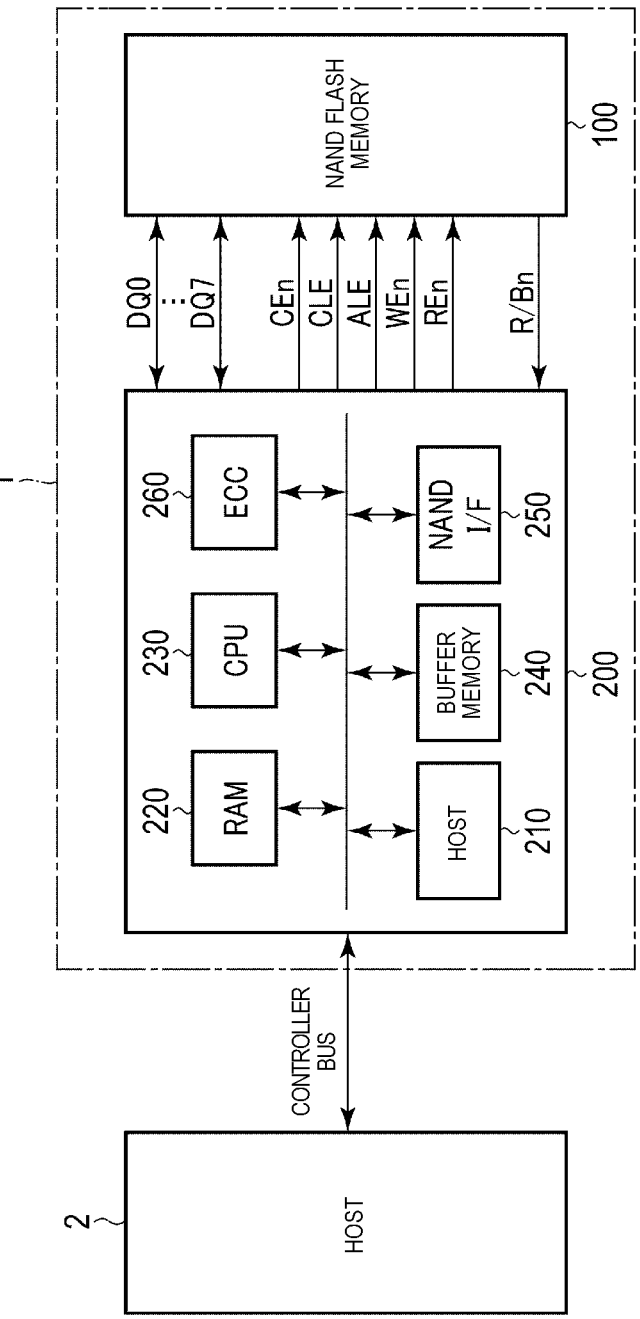
FIG. 1 is a block diagram illustrating a memory system including a semiconductor storage device according to a first embodiment.

Embodiments provide a semiconductor storage device capable of improving processing speeds.

In general, according to one embodiment, a semiconductor storage device includes a memory cell array that includes first to sixth memory cells, first to third bit lines that are respectively connected to the first to third memory cells and are disposed in sequence in a first direction, fourth to sixth bit lines that are respectively connected to the fourth to sixth memory cells and are disposed in sequence in the first direction, a sense amplifier that includes first to sixth sense circuits respectively connected to the first to sixth bit lines and in which the first and fourth sense circuits are arranged along a second direction crossing the first direction, the second and fifth sense circuits are arranged along the second direction, and the third and sixth sense circuits are arranged along the second direction, a data register that includes first to sixth latch circuits respectively connected to the first to sixth sense circuits and in which the first and fourth latch circuits are connected to the first and fourth sense circuits via a first bus, the second and fifth latch circuits are connected to the second and fifth sense circuits via a second bus, and the third and sixth latch circuits are connected to the third and sixth sense circuits via a third bus, and an input and output circuit that is connected to the first and fourth latch circuits via a first data line, is connected to the second and fifth latch circuits via a second data line, and is connected to the third and sixth latch circuits via a third data line.

Hereinafter, embodiments will be described with reference to the drawings. In the description, common reference numerals are given to common elements throughout the drawings.

1. First Embodiment

A semiconductor storage device according to a first embodiment will be described. Hereinafter, a 3-dimensional stacked NAND flash memory in which memory cell transistors are 3-dimensionally stacked above a semiconductor substrate will be given as an example of a semiconductor storage device.

As illustrated in FIG. 1, a memory system 1 includes a NAND flash memory 100 and a controller 200. The controller 200 and the NAND flash memory 100 may be combined in this way to form one semiconductor storage device. Examples include a memory card such as an SD™ card or a solid-state drive (SSD).

The NAND flash memory 100 includes a plurality of memory cell transistors and stores data in a nonvolatile manner. The NAND flash memory 100 is connected to the controller 200 via a NAND bus and operates based on commands from the controller 200. More specifically, the NAND flash memory 100 transmits and receives, for example, 8-bit signals DQ0 to DQ7 (hereinafter simply referred to as signals DQ or signals DQ [7:0] when DQ0 to DQ7 are not specified) to and from the controller 200. The signals DQ0 to DQ7 include, for example, data, addresses, and commands. The NAND flash memory 100 receives, for example, a chip enable signal CEn, a command latch enable signal CLE, an address latch enable signal ALE, a write enable signal WEn, and a read enable signal REn from the controller 200. Then, the NAND flash memory 100 transmits a ready/busy signal R/Bn to the controller 200.

The chip enable signal CEn is a signal for enabling the NAND flash memory 100 and is asserted, for example, at a low ("L") level. The command latch enable signal CLE is a signal indicating that the signal DQ is a command and is asserted, for example, at a high ("H") level. The address latch enable signal ALE is a signal indicating that the signal DQ is an address and is asserted, for example, at the "H" level. The write enable signal WEn is a signal for taking a received signal in the NAND flash memory 100 and is asserted, for example, at the "L" level when a command, an address, data, or the like is received from the controller 200. Accordingly, a signal DQ is taken in the NAND flash memory 100 when the write enable signal WEn is toggled. The read enable signal REn is a signal used for the controller 200 to read data from the NAND flash memory 100. The read enable signal REn is asserted, for example, at the "L" level. Accordingly, the NAND flash memory 100 outputs the signal DQ to the controller 200 based on the toggled read enable signal REn. The ready/busy signal R/Bn is a signal indicating whether the NAND flash memory 100 is in a busy state or a ready state (in a state in which a command is not receivable or receivable from the controller 200) and is considered to be at the "L" level, for example, when the NAND flash memory 100 is in the busy state.

The controller 200 issues a read command, a write command, an erasing command, or the like to the NAND flash memory 100 in response to a command from a host device 2. The controller 200 manages a memory space of the NAND flash memory 100.

The controller 200 includes a host interface circuit 210, an internal memory (RAM) 220, a processor (CPU) 230, a buffer memory 240, a NAND interface circuit 250, and an ECC circuit 260.

The host interface circuit 210 is connected to the host device 2 via a controller bus and governs communication with the host device 2. The host interface circuit 210 transmits commands and data received from the host device 2 to the processor 230 and the buffer memory 240. The host interface circuit 210 transmits data in the buffer memory 240 to the host device 2 in response to a command of the processor 230.

The NAND interface circuit 250 is connected to the NAND flash memory 100 via the NAND bus and governs communication with the NAND flash memory 100. The NAND interface circuit 250 transmits a command received from the processor 230 to the NAND flash memory 100. The NAND interface circuit 250 transmits write data in the buffer memory 240 to the NAND flash memory 100 at the time of writing. Further, the NAND interface circuit 250 transmits data read from the NAND flash memory 100 to the buffer memory 240 at the time of reading.

The processor 230 controls an operation of the entire controller 200. The processor 230 issues various commands in response to commands of the host device 2 to transmit the commands to the NAND flash memory 100. For example, when a write command is received from the host device 2, the processor 230 transmits a write command to the NAND flash memory 100 in response to the write command. The same applies to the time of reading and the time of erasing. The processor 230 executes various processes such as wear leveling to manage the NAND flash memory 100. Further, the processor 230 executes various arithmetic operations. For example, the processor 230 executes a data encryption process or a randomization process.

The ECC circuit 260 executes an error checking and correcting (ECC) process on data.

The internal memory 220 is, for example, a semiconductor memory such as a DRAM and is used as a working area of the processor 230. The internal memory 220 stores firmware or various management tables used to manage the NAND flash memory 100.

1.1.2 Configuration of Semiconductor Storage Device

Figure 2:
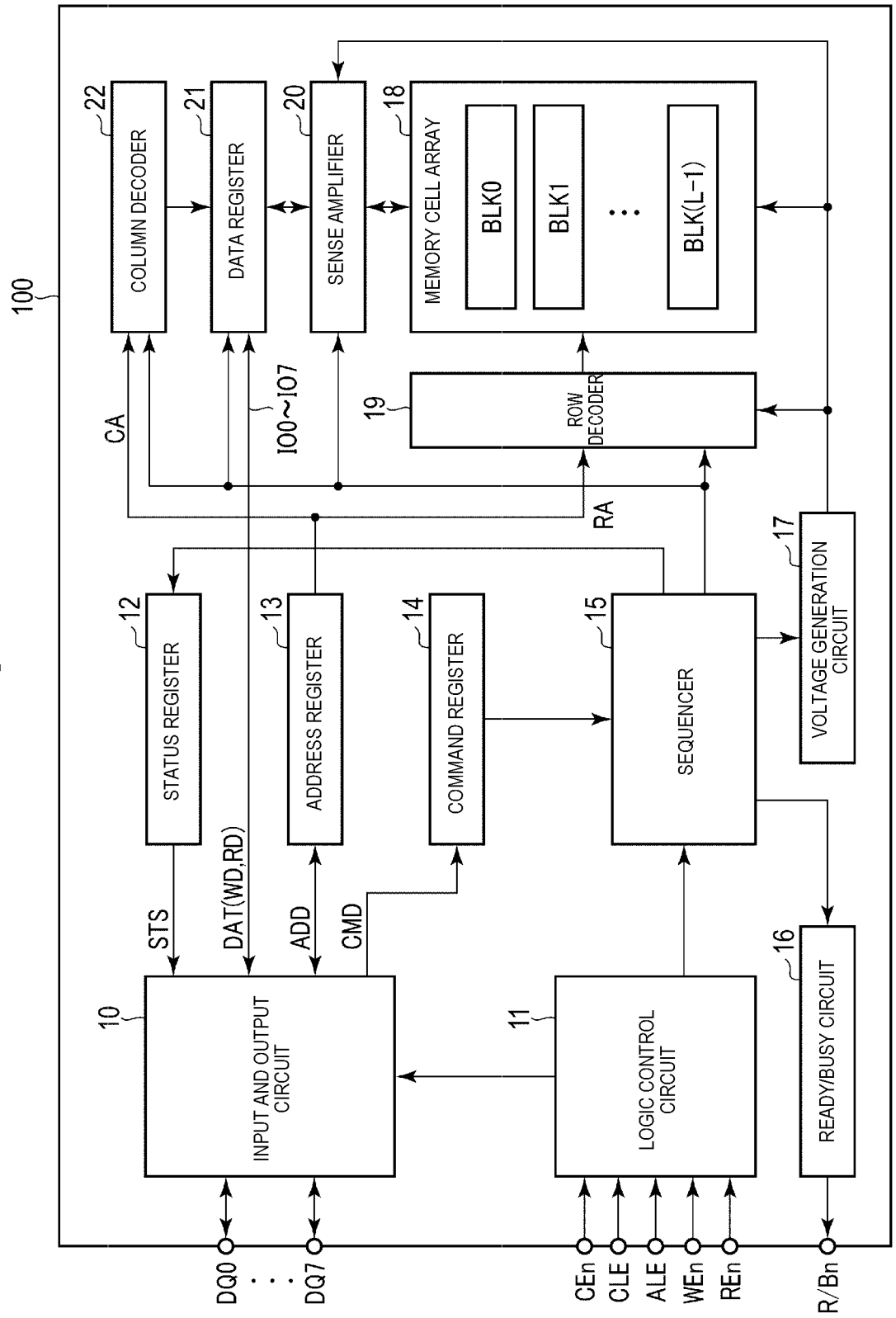
FIG. 2 is a block diagram illustrating the semiconductor storage device according to the first embodiment.

Next, the configuration of the semiconductor storage device will be described with reference to FIG. 2. In FIG. 2, a part of connection between blocks is indicated by arrows, but the connections between the blocks are not limited thereto.

As illustrated in FIG. 2, the NAND flash memory 100 includes an input and output circuit 10, a logic control circuit 11, a status register 12, an address register 13, a command register 14, a sequencer 15, a ready/busy circuit 16, a voltage generation circuit 17, a memory cell array 18, a row decoder 19, a sense amplifier 20, a data register 21, and a column decoder 22.

The input and output circuit 10 controls input and output of the signal DQ to and from the controller 200. More specifically, the input and output circuit 10 includes an input circuit and an output circuit. The input circuit transmits data DAT (write data WD) received from the controller 200 to the data register 21, transmits an address ADD to the address register 13, and transmits a command CMD to the command register 14. The output circuit transmits status information STS received from the status register 12, data DAT (read data RD) received from the data register 21, and the address ADD received from the address register 13 to the controller 200. The input and output circuit 10 and the data register 21 are connected via a data bus. More specifically, for example, the data bus includes 8 data lines IO0 to IO7 corresponding to the signals DQ0 to DQ7. The number of data lines IO is not limited to 8, but may be set 16 or 32 and any number of data lines can be set.

The logic control circuit 11 receives, for example, the chip enable signal CEn, the command latch enable signal CLE, the address latch enable signal ALE, the write enable signal WEn, and the read enable signal REn from the controller 200. Then, the logic control circuit 11 controls the input and output circuit 10 and the sequencer 15 in accordance with a received signal.

The status register 12 temporarily stores the status information STS, for example, in a write operation, a read operation, and an erasing operation for data and notifies the controller 200 whether the operation normally ends.

The address register 13 temporarily stores the address ADD received from the controller 200 via the input and output circuit 10. Then, the address register 13 transmits a row address RA to the row decoder 19 and transmits a column address CA to the column decoder 22.

The command register 14 temporarily stores the command CMD received from the controller 200 via the input and output circuit 10 and transmits the command CMD to the sequencer 15.

The sequencer 15 controls an operation of the entire NAND flash memory 100. More specifically, the sequencer 15 controls, for example, the status register 12, the ready/busy circuit 16, the voltage generation circuit 17, the row decoder 19, the sense amplifier 20, the data register 21, the column decoder 22, and the like according to the command CMD stored in the command register 14 to execute the write operation, the read operation, and the erasing operation.

The ready/busy circuit 16 transmits the ready/busy signal R/Bn to the controller 200 according to an operation state of the sequencer 15.

The voltage generation circuit 17 generates a voltage necessary for a write operation, a read operation, and an erasing operation according to control of the sequencer 15 and supplies the generated voltage, for example, to the memory cell array 18, the row decoder 19, and the sense amplifier 20. The row decoder 19 and the sense amplifier 20 apply a voltage supplied from the voltage generation circuit 17 to memory cell transistors in the memory cell array 18.

The memory cell array 18 includes a plurality of blocks BLK (BLK0, BLK1, . . . , and BLK (L−1)) (where L is an integer equal to or greater than 2) including nonvolatile memory cell transistors (hereinafter also referred to as "memory cells") associated with rows and columns. Each block BLK includes a plurality of string units SU (SU0, SU1, SU2, SU3, . . . ). Each string unit SU includes a plurality of NAND strings SR. The number of blocks BLK in the memory cell array 18 and the number of string units SU in the block BLK may be any number. The details of the memory cell array 18 will be described below.

The row decoder 19 decodes the row address RA. The row decoder 19 selects any block BLK and further selects any string unit SU based on a decoded address. Then, the row decoder 19 applies necessary voltages to the block BLK.

The sense amplifier 20 senses data read from the memory cell array 18 during a read operation. Then, the sense amplifier 20 transmits the read data RD to the data register 21. The sense amplifier 20 transmits the write data WD to the memory cell array 18 in a write operation.

The data register 21 includes a plurality of latch circuits. The latch circuit stores the write data WD and the read data RD. For example, in a write operation, the data register 21 temporarily stores the write data WD received from the input and output circuit 10 and transmits the write data WD to the sense amplifier 20. For example, in a read operation, the data register 21 temporarily stores the read data RD received from the sense amplifier 20 and transmits the read data RD to the input and output circuit 10.

The column decoder 22 decodes the column address CA during, for example, a write operation, a read operation, and an erasing operation and selects a latch circuit in the data register 21 according to a decoding result.

1.1.3 Configuration of Memory Cell Array

Figure 3:
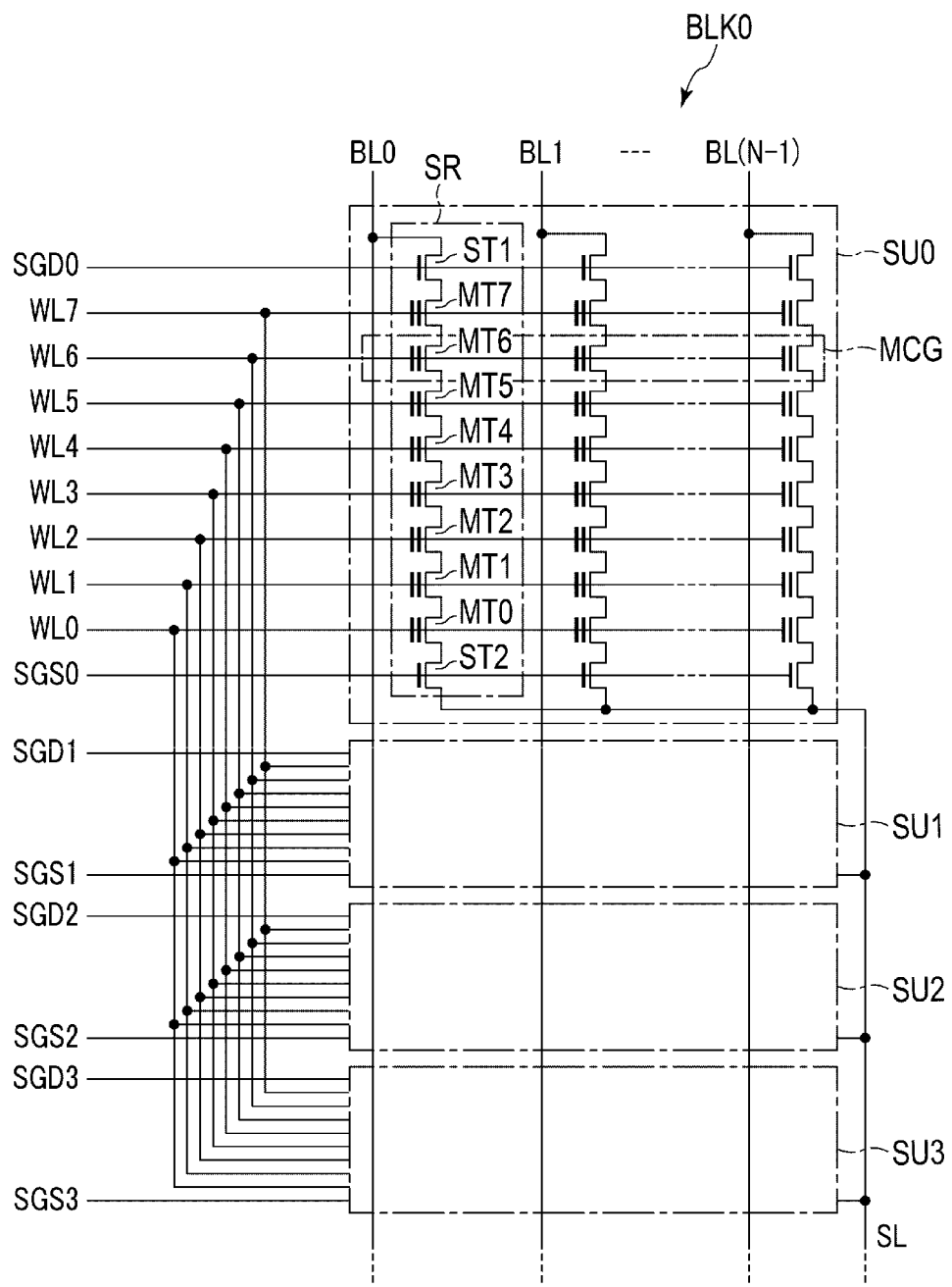
FIG. 3 is a circuit diagram illustrating a memory cell array provided in the semiconductor storage device according to the first embodiment.

Next, the configuration of the memory cell array 18 will be described with reference to FIG. 3. In the example of FIG. 3, the block BLK0 is illustrated. The configurations of the other blocks BLK are also the same.

As illustrated in FIG. 3, the block BLK0 includes, for example, four string units SU (SU0 to SU3). Each string unit SU includes a plurality of NAND strings SR. Each NAND string SR includes, for example, 8 memory cell transistors MT0 to MT7 and select transistors ST1 and ST2. Hereinafter, when the memory cell transistors MT0 to MT7 are not distinguished from each other, the memory cell transistors MT0 to MT7 are referred to as the memory cell transistors MT. The memory cell transistor MT includes a control gate and a charge storage layer and stores data in a nonvolatile manner.

The memory cell transistor MT may be a MONOS transistor in which an insulating film is used in the charge storage layer or may be an FG transistor in which a conductive layer is used in the charge storage layer. Hereinafter, the MONOS transistor will be described as an example in the embodiment. The number of memory cell transistors MT is not limited to 8, but may be 16, 32, 64, or 128. The number of memory cell transistors MT is not limited to any one number. Further, any number of select transistors ST1 and ST2 may be set and may be one or more.

The memory cell transistors MT are connected in series between the source of the select transistor ST1 and the drain of the select transistor ST2. More specifically, in the memory cell transistors MT0 to MT7, current paths are connected in series. The drain of the memory cell transistor MT7 is connected to the source of the select transistor ST1 and the source of the memory cell transistor MT0 is connected to the drain of the select transistor ST2.

In the string units SU0 to SU3, the gates of the select transistors ST1 are connected to select gate lines SGD0 to SGD3, respectively. Similarly, the gates of the select transistors ST2 in the string units SU0 to SU3 are connected to the select gate lines SGS0 to SGS3. Hereinafter, when the select gate lines SGD0 to SGD3 are not distinguished from each other, the select gate lines SGD0 to SGD3 are referred to as the select gate lines SGD. When the select gate lines SGS0 to SGS3 are not distinguished from each other, the select gate lines SGS0 to SGS3 are referred to as the select gate lines SGS. The select gate lines SGS0 to SGS3 of the string units SU may be connected in common.

The control gates of the memory cell transistors MT0 to MT7 in the block BLK are connected in common to the word lines WL0 to WL7, respectively. Hereinafter, when the word lines WL0 to WL7 are not distinguished from each other, the word lines WL0 to WL7 are referred to as the word lines WL.

The drains of the select transistors ST1 of the NAND strings SR in the string unit SU are connected to different bit lines BL0 to BL(N−1) (where N is an integer equal to or greater than 2). Hereinafter, when the bit lines BL0 to BL(N−1) are not distinguished from each other, the bit lines BL0 to BL(N−1) are referred to as the bit lines BL. The bit lines BL connects one NAND string SR in each string unit SU in common across the plurality of blocks BLK. Further, the sources of the plurality of select transistors ST2 are connected in common to a source line SL. That is, the string unit SU is an aggregate of the plurality of NAND strings SR connected to the different bit lines BL and connected to the same select gate lines SGD and SGS. The block BLK is an aggregate of the plurality of string units SU using the word line WL in common. The memory cell array 18 is an aggregate of the plurality of blocks BLK using the bit line BL in common.

Data writing and reading are executed as a group on the memory cell transistors MT connected to any word line WL in any string unit SU. Hereinafter, the group of the memory cell transistors MT selected during the data writing and reading is referred to as a "memory cell group MCG". A collection of 1-bit data written in or read from one memory cell group MCG is referred to as a "page".

Data erasing can be executed in units of blocks BLK or units smaller than the units of blocks BLK. An erasing method is disclosed in, for example, U.S. patent application Ser. No. 13/235,389, filed on 18 Sep. 2011 and entitled "NONVOLATILE SEMICONDUCTOR MEMORY DEVICE," U.S. patent application Ser. No. 12/694,690, filed on 27 Jan. 2010 and entitled "NON-VOLATILE SEMICONDUCTOR STORAGE DEVICE," and U.S. patent application Ser. No. 13/483,610, filed on 30 May 2012 and entitled "NONVOLATILE SEMICONDUCTOR MEMORY DEVICE AND DATA ERASE METHOD THEREOF." The entire contents of these patent applications are incorporated herein by reference.

Further, the memory cell array 18 may employ the configuration disclosed in, for example, U.S. patent application Ser. No. 12/407,403, filed on 19 Mar. 2009 and entitled "THREE DIMENSIONAL STACKED NONVOLATILE SEMICONDUCTOR MEMORY," in U.S. patent application Ser. No. 12/406,524, filed on 18 Mar. 2009 and entitled "THREE DIMENSIONAL STACKED NONVOLATILE SEMICONDUCTOR MEMORY," U.S. patent application Ser. No. 12/679,991, filed on 25 Mar. 2010 and entitled "NON-VOLATILE SEMICONDUCTOR STORAGE DEVICE AND METHOD OF MANUFACTURING THE SAME," and U.S. patent application Ser. No. 12/532,030, filed on 23 Mar. 2009 and entitled "SEMICONDUCTOR MEMORY AND METHOD FOR MANUFACTURING SAME." The entire contents of these patent applications are incorporated herein by reference.

1.1.4 Cross-Sectional Configuration of Memory Cell Array

Figure 4:
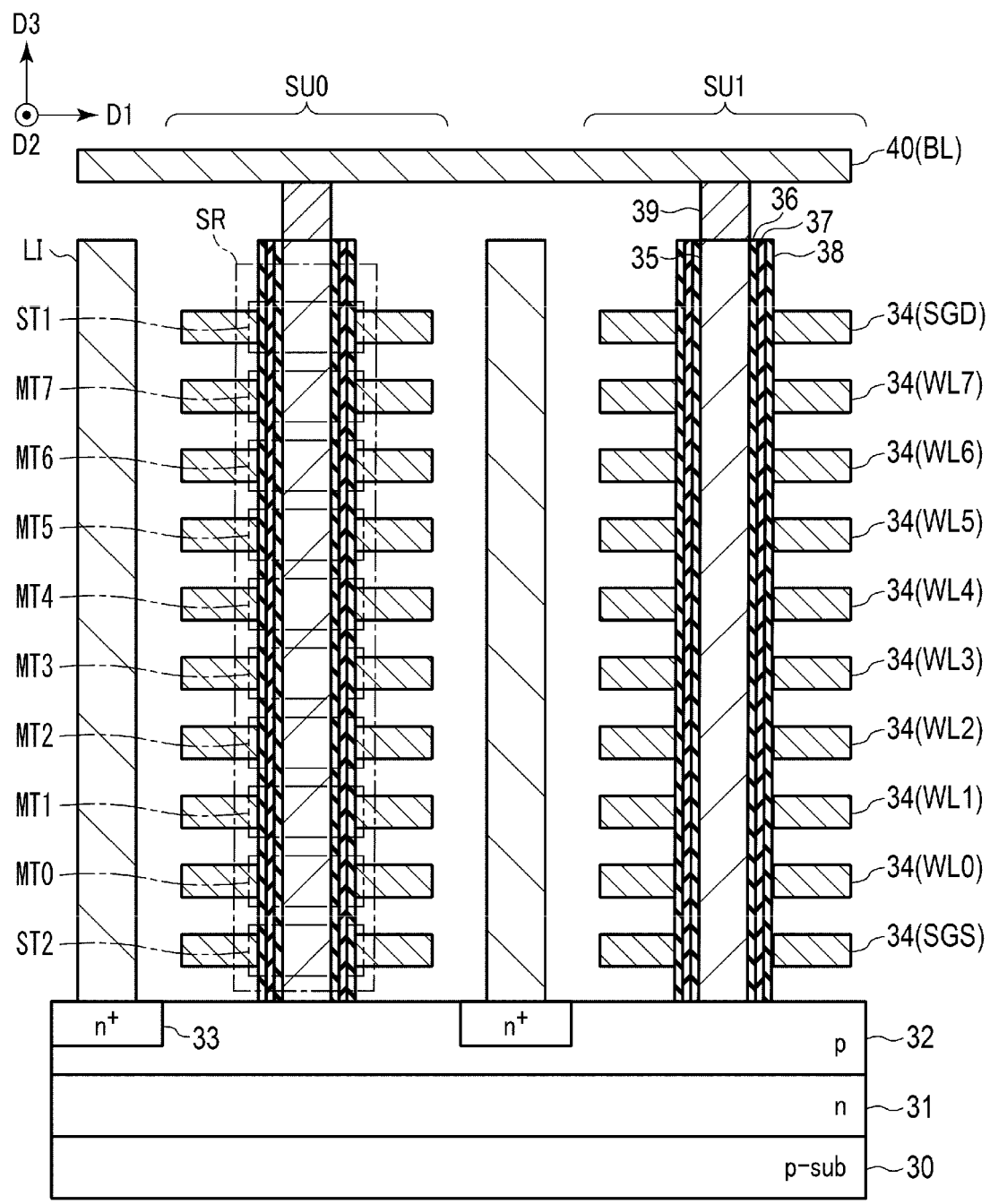
FIG. 4 is a sectional view illustrating the memory cell array provided in the semiconductor storage device according to the first embodiment.

Next, the cross-sectional configuration of the memory cell array 18 will be described with reference to FIG. 4. In the example of FIG. 4, the cross sections of the string units SU0 and SU1 are illustrated and the string units SU2 and SU3 have the same configuration. In FIG. 4, interlayer insulating films are omitted.

As illustrated in FIG. 4, a plurality of source line contacts LI extending in a second direction D2 perpendicular to a first direction D1, are arranged along the first direction D1. One string unit SU is disposed between two source line contacts LI. The source line contacts LI connect the source lines SL (not illustrated) installed above the semiconductor substrate 30 and the NAND strings SR. The source line contacts LI and the NAND strings SR can be set at any position. For example, the plurality of string units SU may be installed between two source line contacts LI. Further, in the example of FIG. 4, to facilitate the description, the plurality of NAND strings SR are disposed in columns arranged along the second direction D2 in one string unit SU. However, the NAND strings SR in one string unit SU can be set at any position. For example, the NAND strings SR may be disposed in parallel in two columns in the second direction D2 or may be a staggered arrangement of four columns.

The NAND strings SR in each string unit SU are formed in a third direction D3 vertical to the semiconductor substrate 30. More specifically, an n type well 31 is installed on the surface region of the semiconductor substrate 30. A p type well 32 is installed on the surface region of the n type well 31. An n+ type diffusion layer 33 is installed in a part of the surface region of the p type well 32. Above the p type well 32, ten wiring layers including the select gate line SGS, the word lines WL0 to WL7 connected to the memory cell transistors MT0 to MT7, and the select gate line SGD are stacked in sequence with interlayer insulating films (not illustrated) interposed therebetween.

A pillar-shaped semiconductor layer 35 penetrating through the ten wiring layers 34 and reaching the p type well 32 is formed. A tunnel insulating film 36, a charge storage layer 37, and a block insulating film 38 are formed in sequence on a side surface of the semiconductor layer 35. For example, polycrystalline silicon is used for the semiconductor layer 35. For example, silicon oxide films are used for the tunnel insulating film 36 and the block insulating film 38. For example, a silicon nitride film is used for the charge storage layer 37. The semiconductor layer 35 functions as a current path of the NAND strings SR and serves as a region in which a channel of each transistor is formed. An upper end of the semiconductor layer 35 is connected to a wiring layer 40 extending in the first direction D1 via a contact plug 39. The wiring layer 40 functions as the bit line BL.

In the example of FIG. 4, each of the wiring layers 34 functioning as the select gate lines SGD and SGS is installed in one layer, but may be installed in a plurality of layers.

The source line contacts LI have a planar shape in the second direction D2. For example, polycrystalline silicon is used for the source line contacts LI. The bottom surface and the upper surface of the source line contact LI are connected to the n+ type diffusion layer 33 and a wiring layer (not illustrated) that functions as the source line SL, respectively.

1.1.5 Configurations of Sense Amplifier and Data Register

Next, the configurations of the sense amplifier 20 and the data register 21 will be described with reference to FIG. 5. The sense amplifier 20 includes a plurality of sense amplifier units SAU (SAU0 to SAU(N−1)) installed to correspond to the bit lines BL (BL0 to BL(N−1)). The example of FIG. 5 is a circuit diagram of the sense amplifier unit SAU corresponding to one bit line BL.

In the embodiment, the sense amplifier unit SAU that employs a current sense scheme to sense a current flowing in the bit line BL, will be described as an example, but the sense amplifier unit SAU that employs a voltage sense scheme may be used. In the following description, one of the source and the drain of a transistor is referred to as a "one end of the transistor" and the other of the source and the drain is referred to as the "other end of the transistor".

The data register 21 includes a plurality of latch circuits XDL installed to correspond to the sense amplifier units SAU. The latch circuit XDL temporarily stores the read data RD received from the sense amplifier unit SAU and the write data WD received from the input and output circuit 10. More specifically, the write data WD received by the input and output circuit 10 is transmitted to the sense amplifier unit SAU via the latch circuit XDL. The read data RD received from the sense amplifier unit SAU is transmitted to the input and output circuit 10 via the latch circuit XDL.

Figure 5:
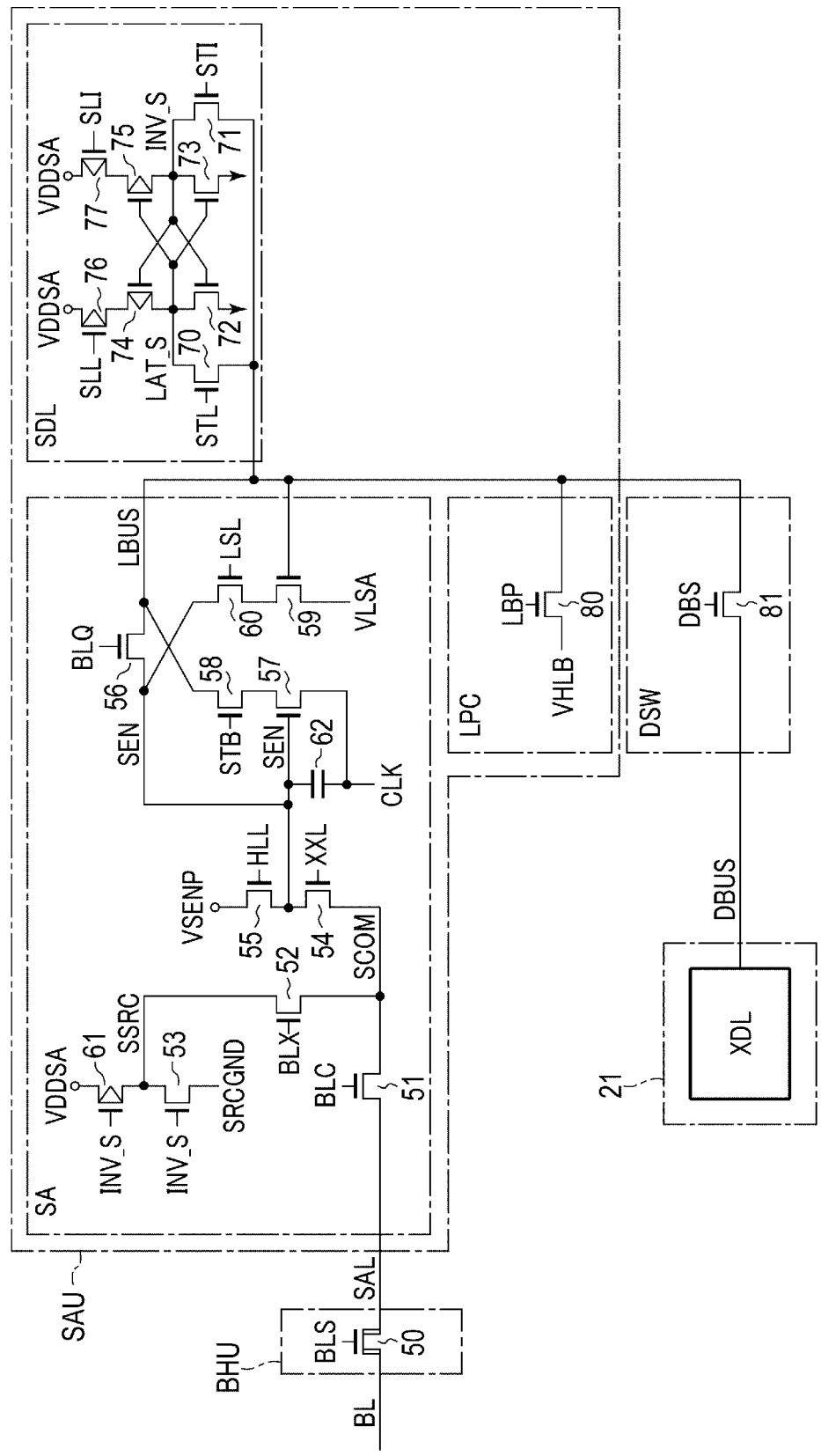
FIG. 5 is a circuit diagram illustrating a sense amplifier provided in the semiconductor storage device according to the first embodiment.

As illustrated in FIG. 5, the sense amplifier unit SAU is connected to the bit line BL via a BL hookup circuit BHU. The sense amplifier unit SAU is connected to the latch circuit XDL in the data register 21 via a DBUS switch circuit DSW.

The BL hookup circuit BHU includes a plurality of high breakdown voltage n-channel MOS transistors 50 installed to correspond to the bit lines BL. One end of the transistor 50 is connected to the corresponding bit line BL and the other end of the transistor 50 is connected to the sense amplifier unit SAU via the corresponding sense amplifier line SAL. The signal BLS is input to the gate of the transistor 50. The signal BLS is a signal for controlling electric connection between the bit line BL and the sense amplifier unit SAU.

The sense amplifier unit SAU includes a sense circuit SA, a latch circuit SDL, and a precharge circuit LPC.

The sense circuit SA includes low breakdown voltage n-channel MOS transistors 51 to 60, a low breakdown voltage p-channel MOS transistor 61, and a capacitive element 62.

A signal BLC is input to the gate of the transistor 51. One end of the transistor 51 is connected to the sense amplifier line SAL and the other end of the transistor 51 is connected to a node SCOM. The transistor 51 is used to clamp the corresponding bit line BL to a potential according to the signal BLC.

A signal BLX is input to the gate of the transistor 52. One end of the transistor 52 is connected to the node SCOM and the other end of the transistor 52 is connected to a node SSRC.

The gate of the transistor 53 is connected to a node INV_S. One end of the transistor 53 is connected to the node SSRC and the other end of the transistor 53 is connected to a node SRCGND. For example, a ground voltage VSS is applied to the node SRCGND.

The gate of the transistor 61 is connected to the node INV_S. A supply voltage VDDSA is applied to one end of the transistor 61 and the other end of the transistor 61 is connected to the node SSRC.

A signal XXL is input to the gate of the transistor 54. One end of the transistor 54 is connected to the node SCOM and the other end of the transistor 54 is connected to a node SEN.

A signal HLL is input to the gate of the transistor 55. A voltage VSENP is applied to one end of the transistor 55 and the other end of the transistor 55 is connected to the node SEN.

One electrode of the capacitive element 62 is connected to the node SEN and a clock signal CLK is input to the other electrode of the capacitive element 62.

The gate of the transistor 57 is connected to the node SEN. One end of the transistor 57 is connected to one end of the transistor 58 and the clock signal CLK is input to the other end of the transistor 57. The transistor 57 functions as a sense transistor that senses a voltage of the node SEN.

A signal STB is input to the gate of the transistor 58. The other end of the transistor 58 is connected to a bus LBUS.

A signal BLQ is input to the gate of the transistor 56. One end of the transistor 56 is connected to the node SEN and the other end of the transistor 56 is connected to the bus LBUS. For example, when the node SEN is charged via the bus LBUS, the transistor 56 is considered to be turned on.

The gate of the transistor 59 is connected to the bus LBUS. One end of the transistor 59 is connected to one end of the transistor 60 and a voltage VLSA is applied to the other end of the transistor 59. The voltage VLSA may be, for example, the ground voltage VSS.

A signal LSL is input to the gate of the transistor 60. The other end of the transistor 60 is connected to the node SEN.

At the time of data writing, the sense circuit SA controls the bit line BL according to data stored in the latch circuit SDL.

The latch circuit SDL includes low breakdown voltage n-channel MOS transistors 70 to 73 and low breakdown voltage p-channel MOS transistors 74 to 77.

A signal STL is input to the gate of the transistor 70. One end of the transistor 70 is connected to the bus LBUS and the other end of the transistor 70 is connected to a node LAT_S.

A signal STI is input to the gate of the transistor 71. One end of the transistor 71 is connected to the bus LBUS and the other end of the transistor 71 is connected to a node INV_S.

The gate of the transistor 72 is connected to the node INV_S. One end of the transistor 72 is grounded (connected to a ground voltage wiring) and the other end of the transistor 72 is connected to the node LAT_S.

The gate of the transistor 73 is connected to the node LAT_S. One end of the transistor 73 is grounded and the other end of the transistor 73 is connected to the node INV_S.

The gate of the transistor 74 is connected to the node INV_S. One end of the transistor 74 is connected to the node LAT_S and the other end of the transistor 74 is connected to one end of the transistor 76.

The gate of the transistor 75 is connected to the node LAT_S. One end of the transistor 75 is connected to the node INV_S and the other end of the transistor 75 is connected to one end of the transistor 77.

A signal SLL is input to the gate of the transistor 76. The supply voltage VDDSA is applied to the other end of the transistor 76.

A signal SLI is input to the gate of the transistor 77. The supply voltage VDDSA is applied to the other end of the transistor 77.

In the latch circuit SDL, a first inverter is formed by the transistors 72 and 74 and a second inverter is formed by the transistors 73 and 75. The latch circuit SDL stores data in the node LAT_S and stores inverted data in the node INV_S.

The sense amplifier unit SAU may include a plurality of latch circuits that has the same configuration as the latch circuit SDL as multi-value operation latch circuits for individual memory cell transistors MT that store data having 2 bits or more. In this case, the latch circuit is connected to the bus LBUS so that data can be transmitted and received.

The precharge circuit LPC precharges the bus LBUS. The precharge circuit LPC includes, for example, a low breakdown voltage n-channel MOS transistor 80. A signal LBP is input to the gate of the transistor 80. One end of the transistor 80 is connected to the bus LBUS and a voltage VHLB is applied to the other end of the transistor 80. The precharge circuit LPC precharges the bus LBUS by transmitting the voltage VHLB to the bus LBUS.

The DBUS switch circuit DSW connects the bus LBUS to the bus DBUS. That is, the DBUS switch circuit DSW connects the sense amplifier unit SAU to the latch circuit XDL in the data register 21. The DBUS switch circuit DSW includes, for example, a low breakdown voltage n-channel MOS transistor 81. A signal DBS is input to the gate of the transistor 81. One end of the transistor 81 is connected to the bus LBUS and the other end of the transistor 81 is connected to the latch circuit XDL in the data register 21 via the bus DBUS.

The various control signals used in the BL hookup circuit BHU, the sense amplifier unit SAU, the DBUS switch circuit DSW in the foregoing configuration are given by, for example, the sequencer 15.

1.2 Connection of Bit Lines and Sense Amplifier

Next, connection of the bit lines BL and the sense amplifier 20 will be described.

1.2.1 Disposition of BL Hookup Circuit, Sense Amplifier, and Data Register

Figure 6:
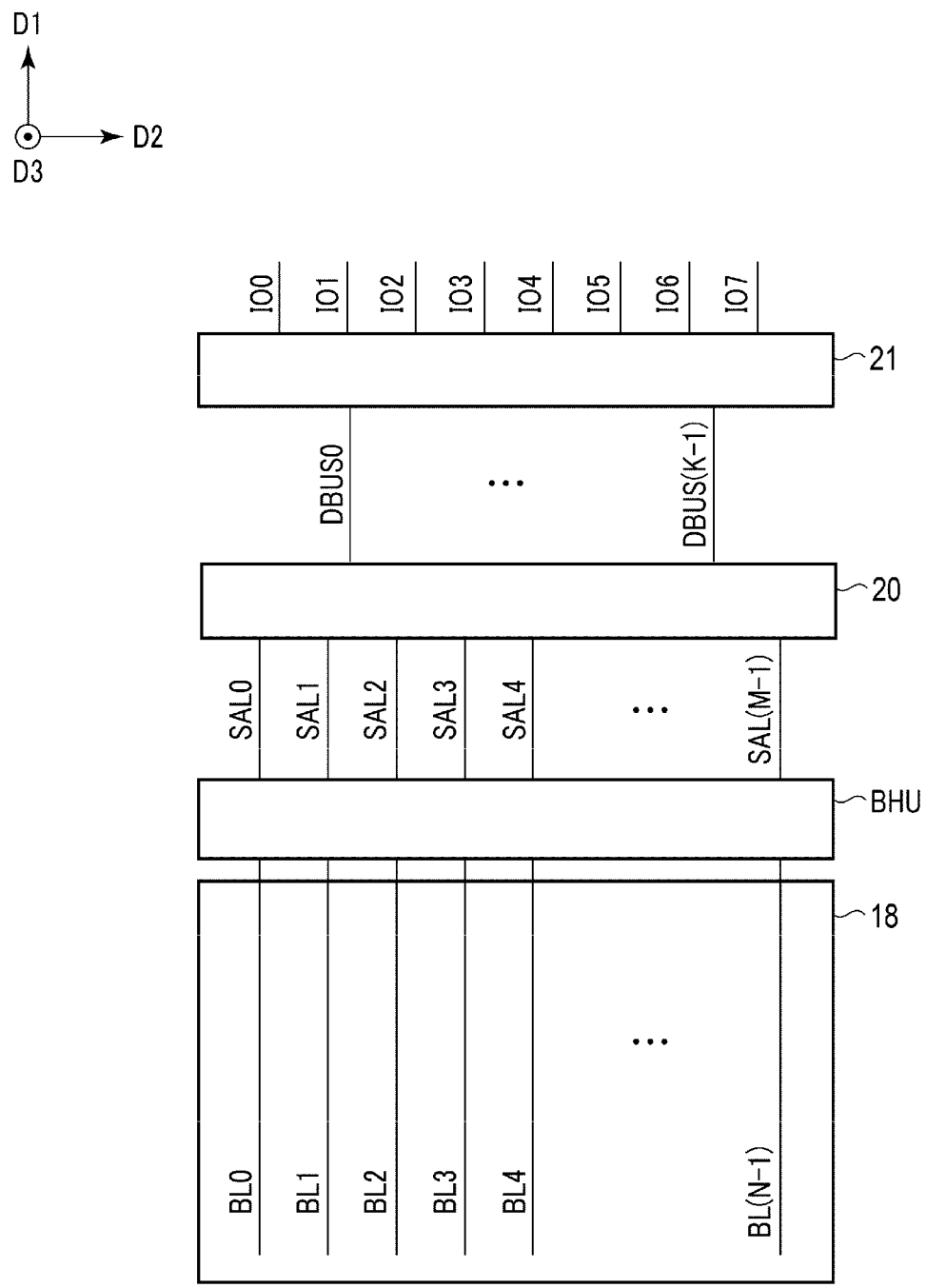
FIG. 6 is a diagram illustrating the layouts of the memory cell array, a BL hookup circuit, the sense amplifier, and a data register in the semiconductor storage device according to the first embodiment.

First, the disposition of the BL hookup circuit BHU, the sense amplifier 20, and the data register 21 will be described with reference to FIG. 6. In the example of FIG. 6, the memory cell array 18, the BL hookup circuit BHU, the sense amplifier unit SAU, and the data register 21 which are formed on the semiconductor substrate, are illustrated.

As illustrated in FIG. 6, the memory cell array 18 is connected to the BL hookup circuit BHU via N bit lines BL (BL0 to BL(N-1)) extending in the first direction D1. The bit lines BL0 to BL (N-1) are disposed in sequence in the second direction D2 with interlayer insulating films (not illustrated) between them.

The BL hookup circuit BHU is connected to the sense amplifier 20 via M (where M is the same number as the integer N) sense amplifier lines SAL (SAL0 to SAL(M-1)) extending in the first direction D1. The sense amplifier lines SAL (SAL0 to SAL(M-1)) are disposed in sequence in the second direction D2 with interlayer insulating films between them. In the embodiment, the number of installed bit lines BL is the same as the number of installed sense amplifier lines SAL, but the sense amplifier lines SAL connected to the bit lines BL0, BL1, BL2, . . . , and BL(N-1) are not arranged in the order of SAL0, SAL1, SAL2, . . . , and SAL(M-1). Connection of the bit lines BL and the sense amplifier lines SAL in the BL hookup circuit BHU will be described below.

In the sense amplifier 20, the sense amplifier lines SAL are connected to the corresponding sense amplifier units SAU, respectively. In the embodiment, the number of installed sense amplifier lines SAL is the same as the number of installed sense amplifier units SAU, but the sense amplifier units SAU connected to the sense amplifier lines SAL0, SAL1, SAL2, and SAL(M-1) are not arranged in the order of SAU0, SAU1, SAU2, . . . , and SAU(N-1). Connection of the sense amplifier lines SAL and the sense amplifier units SAU will be described below.

The sense amplifier 20 is connected to the data register 21 via K (where K is any integer) buses DBUS (DBUS0 to DBUS(K-1)) extending in the first direction D1. The buses DBUS0 to DBUS (K-1) are disposed in sequence in the second direction D2 with interlayer insulating films between them. One bus DBUS connects the plurality of sense amplifier units SAU in the sense amplifier 20 to the plurality of latch circuits XDL in the corresponding data register 21.

The data register 21 is connected to the input and output circuit 10 via 8 data lines IO (IO0 to IO7). In the example of FIG. 6, the data lines IO extend in the first direction D1, but may extend in the second direction D2.

1.2.2 Connection of Bit Line BL, Sense Amplifier, and Data Registers

Figure 7:
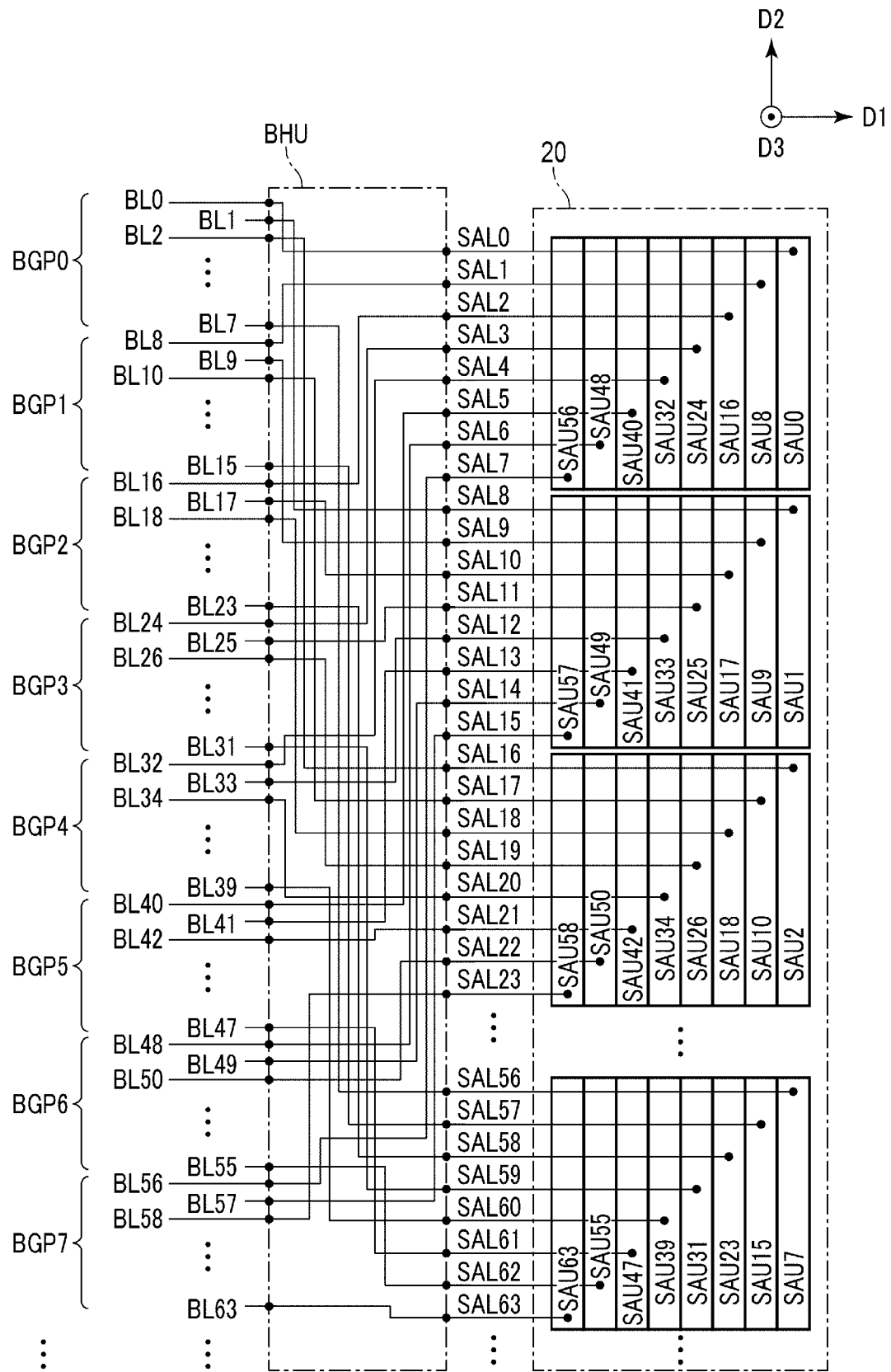
FIG. 7 is a diagram illustrating the layouts of bit lines, the BL hookup circuit, and the sense amplifier in the semiconductor storage device according to the first embodiment.
Figure 8:
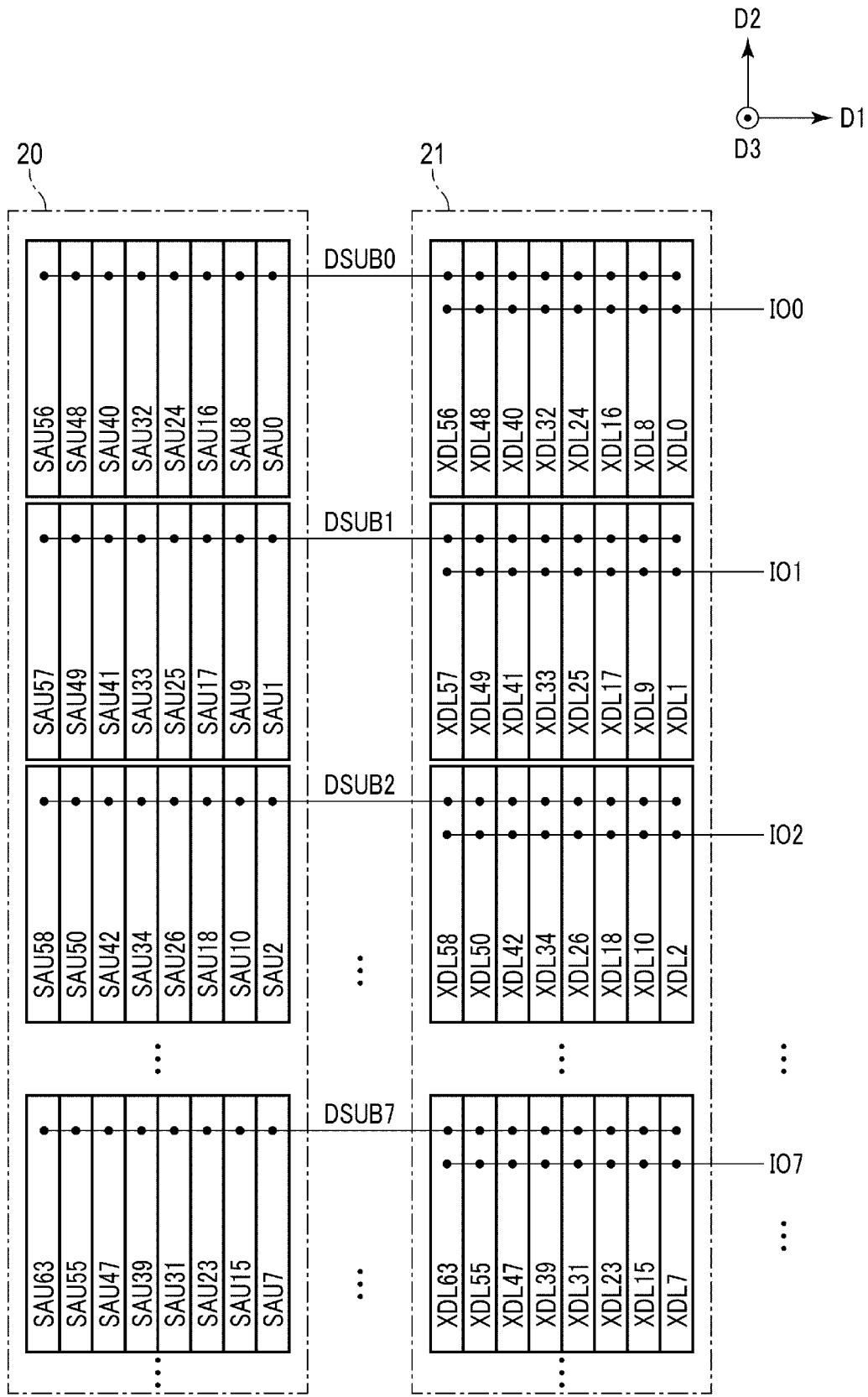
FIG. 8 is a diagram illustrating the layouts of the sense amplifier and the data register in the semiconductor storage device according to the first embodiment.
Figure 9:
FIG. 9 is a table illustrating a relationship among bit lines, sense amplifier lines, sense amplifier units, bus DBUS, latch circuits XDL, and data lines IO in the semiconductor storage device according to the first embodiment.

Next, the details of the connection of the bit line BL, the sense amplifier 20, and the data register 21 will be described with reference to FIGS. 7 to 9. FIG. 7 is a diagram illustrating the layout of the bit line BL, the BL hookup circuit, and the sense amplifier 20. FIG. 8 is a diagram illustrating the layout of the sense amplifier 20 and the data register 21. FIG. 9 is a table illustrating a relationship among the bit lines BL, the sense amplifier lines SAL, the sense amplifier units SAU, the latch circuits XDL, and the data lines 10.

In the examples of FIGS. 7 and 8, connection of some of 64 bit lines BL0 to BL63, the corresponding BL hookup circuit BHU, the sense amplifier units SAU, and the latch circuits XDL, is illustrated. In the example of FIG. 7, any layout of wirings in the BL hookup circuit BHU can be employed so long as there is no change in the connection relationship between the bit lines BL and the sense amplifier lines SAL.

Hereinafter, the plurality of bit lines BL disposed in sequence in the second direction D2 are referred to as a "bit line group BGP". In the embodiment, 8 bit lines BL disposed in sequence in the second direction D2 will be described as one bit line group BGP. For example, the bit lines BL0 to BL7 is notated as a bit line group BGP0. The same applies to the other bit lines BL.

As illustrated in FIG. 7, the bit lines BL0 to BL63 are disposed in sequence in the second direction D2. The bit lines BL0 to BL7 are included in the bit line group BGP0. Similarly, the bit lines BL8 to BL15 are included in a bit line group BGP1, the bit lines BL16 to BL23 are included in a bit line group BGP2, and the bit lines BL24 to BL31 are included in a bit line group BGP3. The bit lines BL32 to BL39 are included in a bit line group BGP4 and the bit lines BL40 to BL47 are included in a bit line group BGP5. The bit lines BL48 to BL55 are included in a bit line group BGP6 and the bit lines BL56 to BL63 are included in a bit line group BGP7.

In the BL hookup circuit BHU, 8 bit lines BL of one bit line group BGP disposed in sequence in the second direction D2 are connected to 8 sense amplifier lines SAL (8 sense amplifier units SAU) corresponding to the data lines IO0 to IO7 illustrated in FIG. 8. More specifically, for example, of the bit lines BL0 to BL7 of the bit line group BGP0, the bit line BL0 is connected to the sense amplifier unit SAU0 corresponding to the data line IO0 via the sense amplifier line SAL0. The bit line BL1 is connected to the sense amplifier unit SAU1 corresponding to the data line IO1 via the sense amplifier line SAL8. The bit line BL2 is connected to the sense amplifier unit SAU2 corresponding to the data line 102 via the sense amplifier line SAL16. Similarly, the bit line BL3 (not illustrated) is connected to the sense amplifier unit SAU3 corresponding to the data line IO3 via the sense amplifier line SAL24. The bit line BL4 is connected to the sense amplifier unit SAU4 corresponding to the data line 104 via the sense amplifier line SAL32. The bit line BL5 is connected to the sense amplifier unit SAU5 corresponding to the data line 105 via the sense amplifier line SAL40. The bit line BL6 is connected to the sense amplifier unit SAU6 corresponding to the data line IO6 via the sense amplifier line SAL48. The bit line BL7 is connected to the sense amplifier unit SAU7 corresponding to the data line IO7 via the sense amplifier line SAL56.

Of the bit lines BL8 to BL15 of the bit line group BGP1, the bit line BL8 is connected to the sense amplifier unit SAU8 corresponding to the data line IO0 via the sense amplifier line SAL1. The bit line BL9 is connected to the sense amplifier unit SAU9 corresponding to the data line IO1 via the sense amplifier line SAL9. The bit line BL10 is connected to the sense amplifier unit SAU10 corresponding to the data line 102 via the sense amplifier line SAL17. Similarly, the bit line BL11 (not illustrated) is connected to the sense amplifier unit SAU11 corresponding to the data line IO3 via the sense amplifier line SAL25. The bit line BL12 is connected to the sense amplifier unit SAU12 corresponding to the data line 104 via the sense amplifier line SAL33. The bit line BL13 is connected to the sense amplifier unit SAU13 corresponding to the data line 105 via the sense amplifier line SAL41. The bit line BL14 is connected to the sense amplifier unit SAU14 corresponding to the data line IO6 via the sense amplifier line SAL49. The bit line BL15 is connected to the sense amplifier unit SAU15 corresponding to the data line IO7 via the sense amplifier line SAL57.

The same applies to the other bit line groups BGP. Any number of bit lines BL included in one bit line group BGP can be set. For example, the number of bit lines BL included in the bit line group BGP may be set according to the number of sense amplifier units SAU connected to one DBUS or the number of data lines IO.

Next, connection of the sense amplifier units SAU and the latch circuits XDL will be described.

As illustrated in FIG. 8, 8 sense amplifier units SAU disposed to be adjacent to each other in the first direction D1 and 8 latch circuits XDL disposed to be adjacent to each other in the first direction D1 are connected in common via one bus DBUS. More specifically, the sense amplifier units SAU0, SAU8, SAU16, SAU24, SAU32, SAU40, SAU48, and SAU56 disposed in the first direction D1 are connected to the latch circuits XDL0, XDL8, XDL16, XDL24, XDL32, XDL40, XDL48, and XDL56 disposed in the first direction D1 via the bus DBUS0. The latch circuits XDL0, XDL8, XDL16, XDL24, XDL32, XDL40, XDL48, and XDL56 are connected to the data line IO0. The disposition of the sense amplifier units SAU0, SAU8, SAU16, SAU24, SAU32, SAU40, SAU48, and SAU56 may be exchanged. Similarly, the disposition of the latch circuits XDL0, XDL8, XDL16, XDL24, XDL32, XDL40, XDL48, and XDL56 may be exchanged.

The sense amplifier units SAU1, SAU9, SAU17, SAU25, SAU33, SAU41, SAU49, and SAU57 disposed in the first direction D1 are connected to the latch circuits XDL1, XDL9, XDL17, XDL25, XDL33, XDL41, XDL49, and XDL57 disposed in the first direction D1 via the bus DBUS1. The latch circuits XDL1, XDL9, XDL17, XDL25, XDL33, XDL41, XDL49, and XDL57 are connected to the data line IO1. The same applies to the sense amplifier units SAU and the latch circuits XDL connected to the other buses DBUS.

Next, a relationship among the bit lines BL, the sense amplifier lines SAL, the sense amplifier units SAU, the latch circuits XDL, the buses DBUS, and the data lines IO will be described.

As illustrated in FIG. 9, the bit line BL0 is connected to the data line IO0 via the sense amplifier line SAL0, the sense amplifier unit SAU0, the bus DBUS0, and the latch circuit XDL0. The bit line BL1 is connected to the data line IO1 via the sense amplifier line SAL8, the sense amplifier unit SAU1, the bus DBUS1, and the latch circuit XDL1. The bit line BL2 is connected to the data line IO2 via the sense amplifier line SAL16, the sense amplifier unit SAU2, the bus DBUS2, and the latch circuit XDL2. The bit line BL3 is connected to the data line IO3 via the sense amplifier line SAL24, the sense amplifier unit SAU3, the bus DBUS3, and the latch circuit XDL3. The bit line BL4 is connected to the data line IO4 via the sense amplifier line SAL32, the sense amplifier unit SAU4, the bus DBUS4, and the latch circuit XDL4. The bit line BL5 is connected to the data line IO5 via the sense amplifier line SAL40, the sense amplifier unit SAU5, the bus DBUS5, and the latch circuit XDL5. The bit line BL6 is connected to the data line IO6 via the sense amplifier line SAL48, the sense amplifier unit SAU6, the bus DBUS6, and the latch circuit XDL6. The bit line BL7 is connected to the data line IO7 via the sense amplifier line SAL56, the sense amplifier unit SAU7, the bus DBUS7, and the latch circuit XDL7. The same applies to the other bit lines BL.

For example, a variable a (where a is an integer satisfying the relation $a^2 \leq N$) indicates the number of bit lines BL included in one bit line group BGP. A variable n (where n is an integer satisfying the relation $n \leq (N-1)$) indicates numerals of the bit line BL, the sense amplifier unit SAU, and the latch circuit XDL. A variable m (where m is an integer satisfying the relation $m \leq (N-1)$) indicates a numeral of the sense amplifier line SAL. Then, a relationship between the bit line BL and the sense amplifier line SAL corresponding to the bit line BL, that is, a relationship among the variables a, n, and m is as follows.

$$m = \text{quotient}(n,a) + a \cdot \text{mod}(n,a) + (a^2 - a) \cdot \text{quotient}(n,a^2).$$

Here, for example, quotient (n,a) indicates a quotient obtained by dividing n by a and quotient (n, $a^2$) indicates a quotient function indicating a quotient obtained by dividing n by $a^2$. In addition, mod (n,a) indicates a mod function indicating an integer remainder obtained by dividing n by a.

Hereinafter, the data register 21 notates, for example, 8-bit data output once via 8 data lines IO0 to IO7 as "column data". When data read to the sense amplifier 20 via the 8 bit lines BL disposed in sequence in the second direction D2 corresponds to the column data, the sense amplifier 20 can transmit the column data to the data register 21 through a data transmission operation performed once. More specifically, the sense amplifier 20 can transmit, for example, the data of the sense amplifier units SAU0 to SAU7 connected to the bit lines BL0 to BL7 of the bit line group BGP0 to the data register 21 through the data transmission operation performed once. Then, the data register 21 can output the column data corresponding to the 8 bit lines BL disposed in sequence in the second direction D2.

1.3 Read Operation

Next, a read operation will be described. The read operation broadly includes cell reading and cache reading. The cell reading is an operation of reading data from the memory cell array 18 to the data register 21, that is, the latch circuit XDL. The cache reading is an operation of reading data from the data register 21 via the input and output circuit 10 to the controller 200. In the cell read operation, there are two modes called "first cell reading" and "second cell reading". Thus, the NAND flash memory 100 executes the cell read operation in one mode based on a command received from the controller 200. The first cell reading and the second cell reading are different in a period in which a ready/busy signal is considered to be at the "L" level during the cell read operation. That is, a period in which the NAND flash memory receives a cell read command and then can receive a cache read command differs. A period in which the ready/busy signal is at the "L" level is shorter during the second cell reading than during the first cell reading. An operation of transmitting data from the memory cell array 18 to the data register 21 is the same between the first cell reading and the second cell reading.

1.3.1 Operation of Controller During First Cell Reading

First, an operation of the controller 200 during the first cell reading will be described with reference to FIG. 10. In the following description, a signal indicating that the NAND flash memory 100 is a working state is referred to as an "internal busy signal". The internal busy signal is considered to be at the "L" level (busy state) when the NAND flash memory 100 is in the working state. For example, the controller 200 can confirm the internal busy signal (for example, whether the data register 21 is in the busy state) by transmitting a status read command ("70h") to the NAND flash memory 100.

Figure 10:
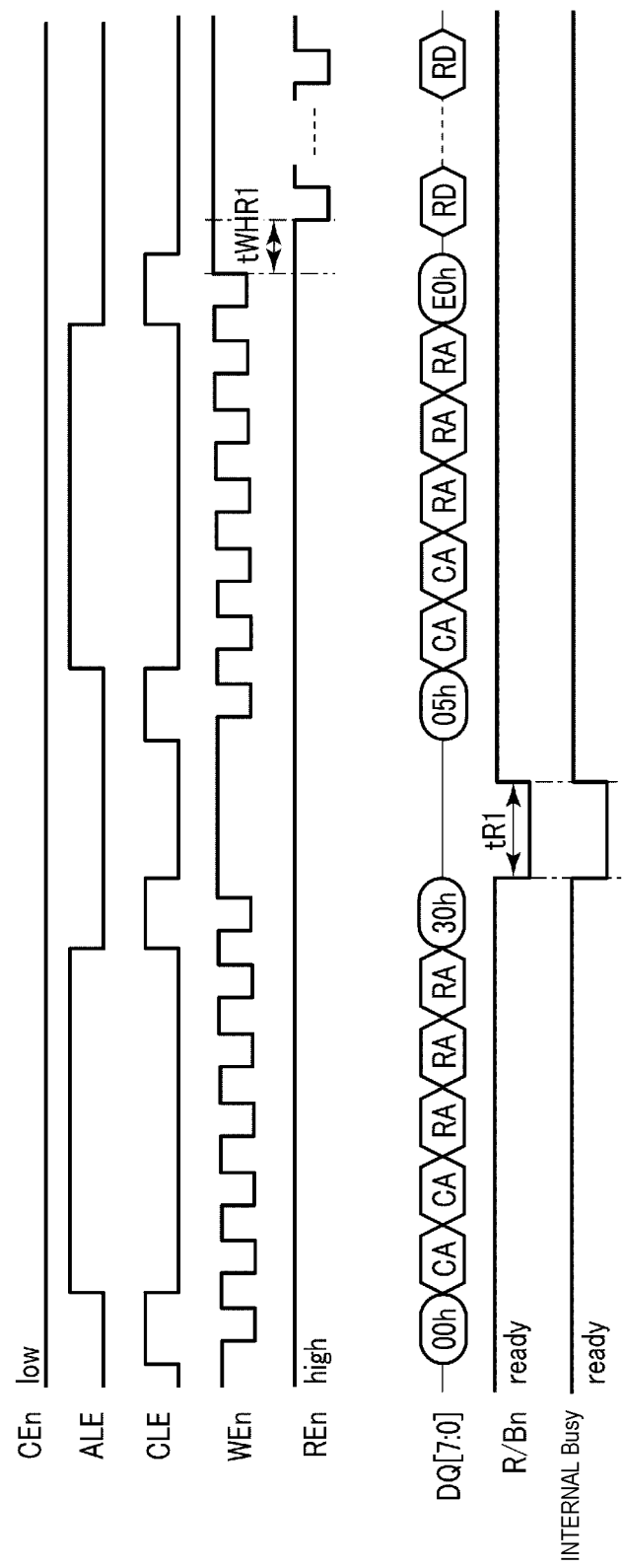
FIG. 10 is a timing chart illustrating various signals during first cell reading and cache reading in the memory system including the semiconductor storage device according to the first embodiment.

As illustrated in FIG. 10, the controller 200 transmits a first cell read command (a command CMD and an address ADD) to the NAND flash memory 100. More specifically, the controller 200 first transmits command "00h" to the NAND flash memory 100 to notify the NAND flash memory 100 that the NAND flash memory 100 is to execute the first cell reading and asserts the command latch enable signal CLE to the "H" level.

Subsequently, the controller 200 transmits the address ADD and asserts the address latch enable signal ALE to the "H" level. In the example of FIG. 10, a case in which the row address RA is transmitted by three cycles after the column address CA is transmitted by two cycles is illustrated. However, any number of cycles of the column address CA and the row address RA can be set.

Further, the controller 200 transmits a first cell read command "30h" to give an instruction to execute the first cell reading and asserts the command latch enable signal CLE to the "H" level.

The NAND flash memory 100 starts the cell reading according to the first cell read command "30h". At this time, the ready/busy signal R/Bn and the internal busy signal are considered to be at the "L" level (busy state) together. The sense amplifier 20 reads the data from the memory cell array 18 and subsequently transmits the read data to the data register 21. Hereinafter, a period in which the sense amplifier 20 starts the reading of the data from the memory cell array 18 and ends the transmission of the read data to the data register 21 is referred to as a "period tR1". During the first cell reading, the ready/busy signal R/Bn and the internal busy signal are considered to be at the "L" level (busy state) together during the period tR1.

When the controller 200 confirms that the ready/busy signal R/Bn returns to the "H" level (ready state), the controller 200 transmits a cache read command to the NAND flash memory 100. More specifically, the controller 200 first transmits a command "05h" to the NAND flash memory 100 to notify the NAND flash memory 100 that the NAND flash memory 100 is to execute the cache reading and asserts the command latch enable signal CLE to the "H" level.

Subsequently, the controller 200 transmits a column address CA as the address ADD by two cycles, transmits the row address RA by three cycles, and asserts the address latch enable signal ALE to the "H" level. In the cache reading after the first cell reading, the column address CA transmitted during the first cell reading may differ from the column address CA transmitted in the cache reading. The row address RA may be omitted in the address ADD in the cache reading.

Subsequently, the controller 200 transmits a cache read command "E0h" to give an instruction to execute the cache reading and asserts the command latch enable signal CLE to the "H" level.

The NAND flash memory 100 starts the cache reading according to the cache read command "E0h". More specifically, the controller 200 transmits the read enable signal REn with the "L" level after a waiting period tWHR1 elapses from rising of the write enable signal WEn corresponding to the command "E0h" from the "L" level to the "H" level. The NAND flash memory 100 transmits the read data RD to the controller 200 based on the read enable signal REn.

1.3.2 Operation of Controller During Second Cell Reading

Next, an operation of the controller 200 during the second cell reading will be described with reference to FIG. 11. Hereinafter, only differences from FIG. 10 will be described.

Figure 11:
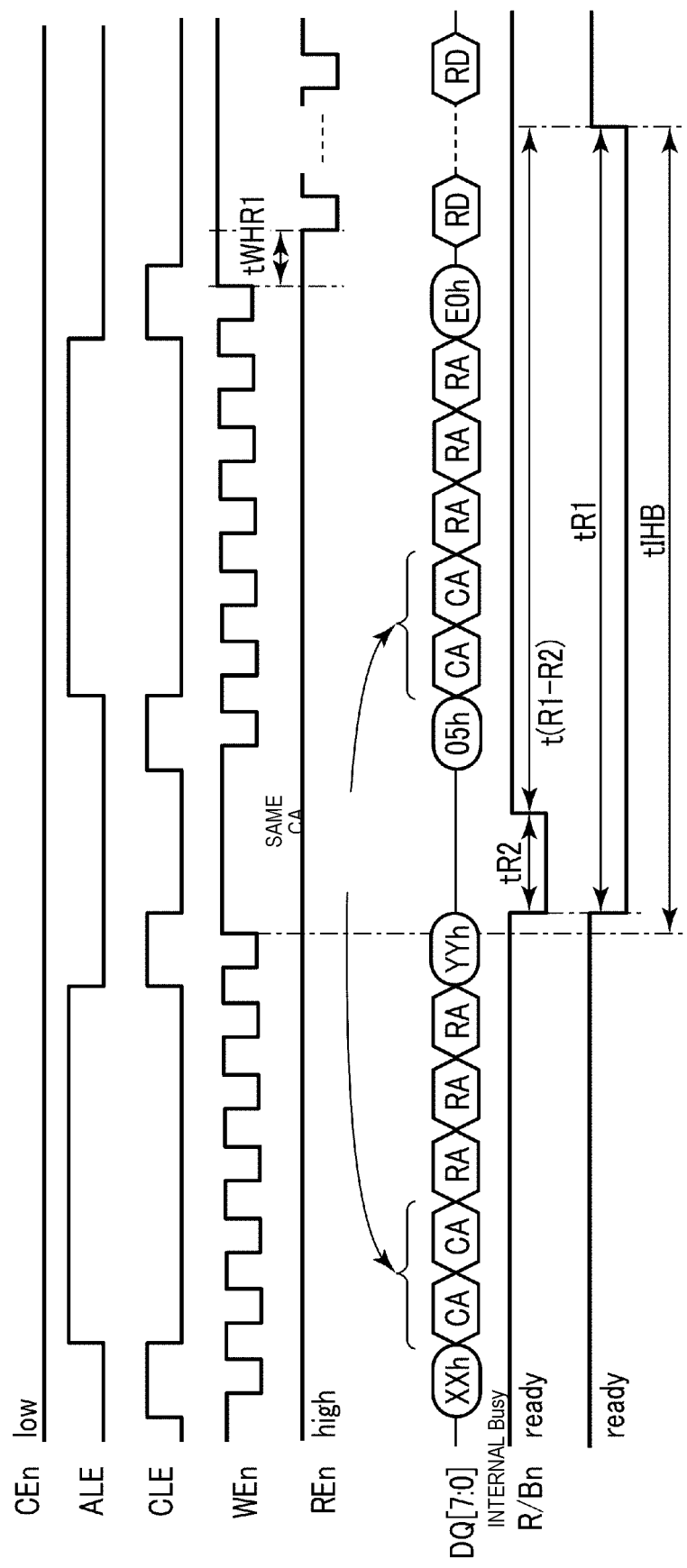
FIG. 11 is a timing chart illustrating various signals during second cell reading and cache reading in the memory system including the semiconductor storage device according to the first embodiment.

As illustrated in FIG. 11, the controller 200 transmits a second cell read command to the NAND flash memory 100. More specifically, the controller 200 first transmits a command "XXh" to the NAND flash memory 100 to notify the NAND flash memory 100 that the NAND flash memory 100 is to execute the second cell reading.

Subsequently, the controller 200 transmits the column address CA and the row address RA and subsequently transmits a second read command "YYh" to give an instruction to execute the second cell reading.

The NAND flash memory 100 starts the cell reading according to the second cell read command "YYh". At this time, the ready/busy signal R/Bn and the internal busy signal are considered to be at the "L" level (busy state) together. The sense amplifier 20 reads the data from the memory cell array 18 and subsequently transmits the read data to the data register 21. At this time, the sense amplifier 20 transmits the column data at a leading column of the column address CA designated during the second cell reading in the first data transmission to the data register 21. Then, when the transmission of the column data at the leading column ends, the NAND flash memory 100 sets the ready/busy signal R/Bn to the "H" level. Hereinafter, a period in which the sense amplifier 20 starts the data reading and ends the transmission of the column data which is the leading column to the data register 21 is referred to as a "period tR2". The data transmitted during the period tR2 is not limited to the column data at the leading column. The number of times the data is transmitted during the period tR2 may be set to the number of times less than the number of times the transmission of the data ends. The period tR2 may be shorter than the period tR1.

The sense amplifier 20 considers the ready/busy signal R/Bn to be at the "H" level and subsequently transmits the remaining data to the data register 21. Accordingly, the internal busy signal is considered to be at the "L" level until the period tR1 ends.

When the controller 200 confirms that the ready/busy signal R/Bn returns to the "H" level (ready state), the controller 200 transmits the cache read command to the NAND flash memory 100. More specifically, the controller 200 transmits the command "05h", the column address CA and the row address RA, and the cache read command "E0h" in this order.

In the case of the second cell reading, the column address CA of the cache reading is set to be the same as the column address CA of the second cell reading. During the first cell reading, the data is transmitted in a preset order when the data is transmitted from the sense amplifier 20 to the data register 21. On the other hand, during the second cell reading, first data to be transmitted from the sense amplifier 20 to the data register 21 is determined based on the column address CA of the second cell reading. Accordingly, when the column address CA of the cache reading differs from the column address CA of the second cell reading, the transmission of the data from the sense amplifier 20 to the data register 21 has not yet been completed. Therefore, the NAND flash memory 100 may not output the data. In this case, the NAND flash memory 100 may transmit an error signal indicating that the reading may not be executed to the controller 200. Alternatively, the NAND flash memory 100 may set the cache reading to a waiting state until the period tR1 ends, that is, the transmission of the data from the sense amplifier 20 to the data register 21 ends. That is, the NAND flash memory 100 may extend the waiting period tWHR1 until the period tR1 ends. After the period tR1 ends, the transmission of the data to the data register 21 ends. Therefore, the controller 200 may designate a different column address CA in the cache reading. Hereinafter, a period in which the second cell read command "YYh" is input and the period tR1 ends is referred to as a "column address change inhibition period tIHB".

After the period tR2, the NAND flash memory 100 can start transmitting the read data RD based on the read enable signal REn even in the state in which the period tR1 does not end. Accordingly, during a period in which the period tR1 ends after the period tR2 (hereinafter referred to as a "period t(R1-R2)"), the NAND flash memory 100 transmits the remaining data from the sense amplifier 20 to the data register 21 concurrently with the cache reading.

1.3.3 Entire Flow of Read Operation in NAND Flash Memory

Next, the entire flow of the read operation in the NAND flash memory 100 will be described with reference to FIG. 12.

Figure 12:
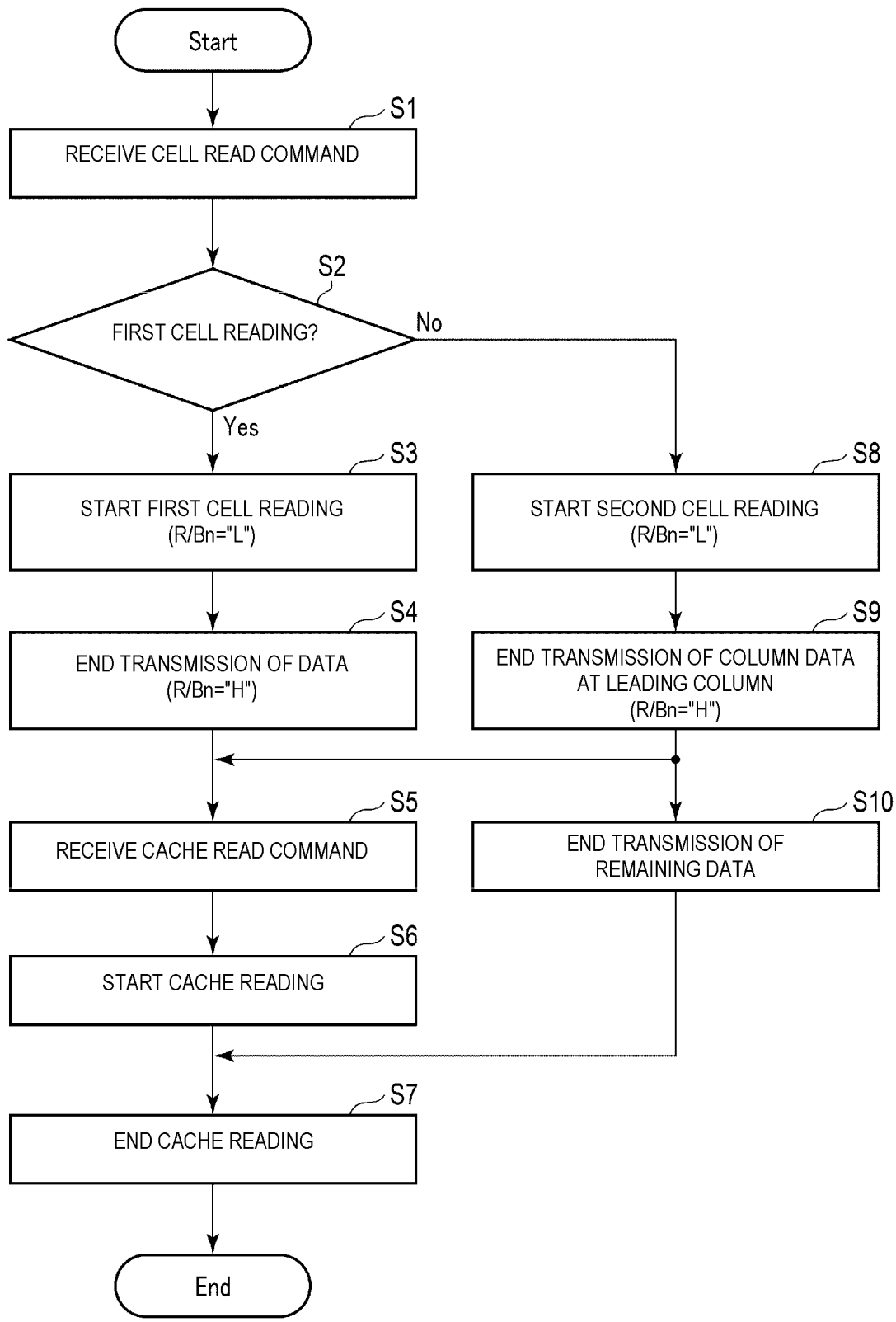
FIG. 12 is a flowchart illustrating a read operation in the semiconductor storage device according to the first embodiment.

As illustrated in FIG. 12, the NAND flash memory 100 receives the cell read command from the controller 200 (step S1).

When the first cell read command is received (Yes in step S2), the sequencer 15 starts the first cell reading (step S3). At this time, the ready/busy signal R/Bn is considered to be at the "L" level. More specifically, the sense amplifier 20 reads the data from the memory cell array 18 and transmits the read data to the data register 21.

When the transmission of the data from the sense amplifier 20 to the data register 21 ends, the sequencer 15 sets the ready/busy signal R/Bn to the "H" level and ends the first cell reading (step S4).

Subsequently, the sequencer 15 receives the cache read command from the controller 200 (step S5).

The sequencer 15 starts the cache reading based on the cache read command (step S6). More specifically, the sequencer 15 transmits the data to the controller 200 based on the read enable signal REn.

When the transmission of the data to the controller 200 ends, the sequencer 15 ends the cache reading (step S7).

When the second cell read command is received, the decision in step S2 is No, and the sequencer 15 starts the second cell reading (step S4). At this time, the ready/busy signal R/Bn is considered to be at the "L" level.

When the transmission of the column data at the leading column from the sense amplifier 20 to the data register 21 ends, the sequencer 15 sets the ready/busy signal R/Bn to the "H" level (step S9).

Even after the ready/busy signal R/Bn is considered to be at the "H" level, the sense amplifier 20 transmits the remaining data to the data register 21. Then, when the transmission of the remaining data ends (step S10), the sequencer 15 ends the second cell reading.

When the cache read command is received while the sense amplifier 20 transmits the remaining data to the data register 21 (step S5), the sequencer 15 starts the cache read command (step S6). Then, the sequencer 15 ends the transmission of the data by the sense amplifier 20 (step S10) and the transmission of the data to the controller 200 ends, the sequencer 15 ends the cache reading (step S7).

1.4 Specific Example of Transmission of Data During Second Cell Reading

Next, two examples will be described as specific examples of transmission of the data during the second cell reading.

1.4.1 Case of Transmission of Data Corresponding to Bit Lines BL0 to BL63

First, a case of transmission of the data corresponding to the bit lines BL0 to BL63 will be described with reference to FIGS. 13 to 17. In the example of FIGS. 13 to 17, to facilitate the description, a case of transmission of the data corresponding to the bit lines BL0 to BL63 will be described.

Figure 13:
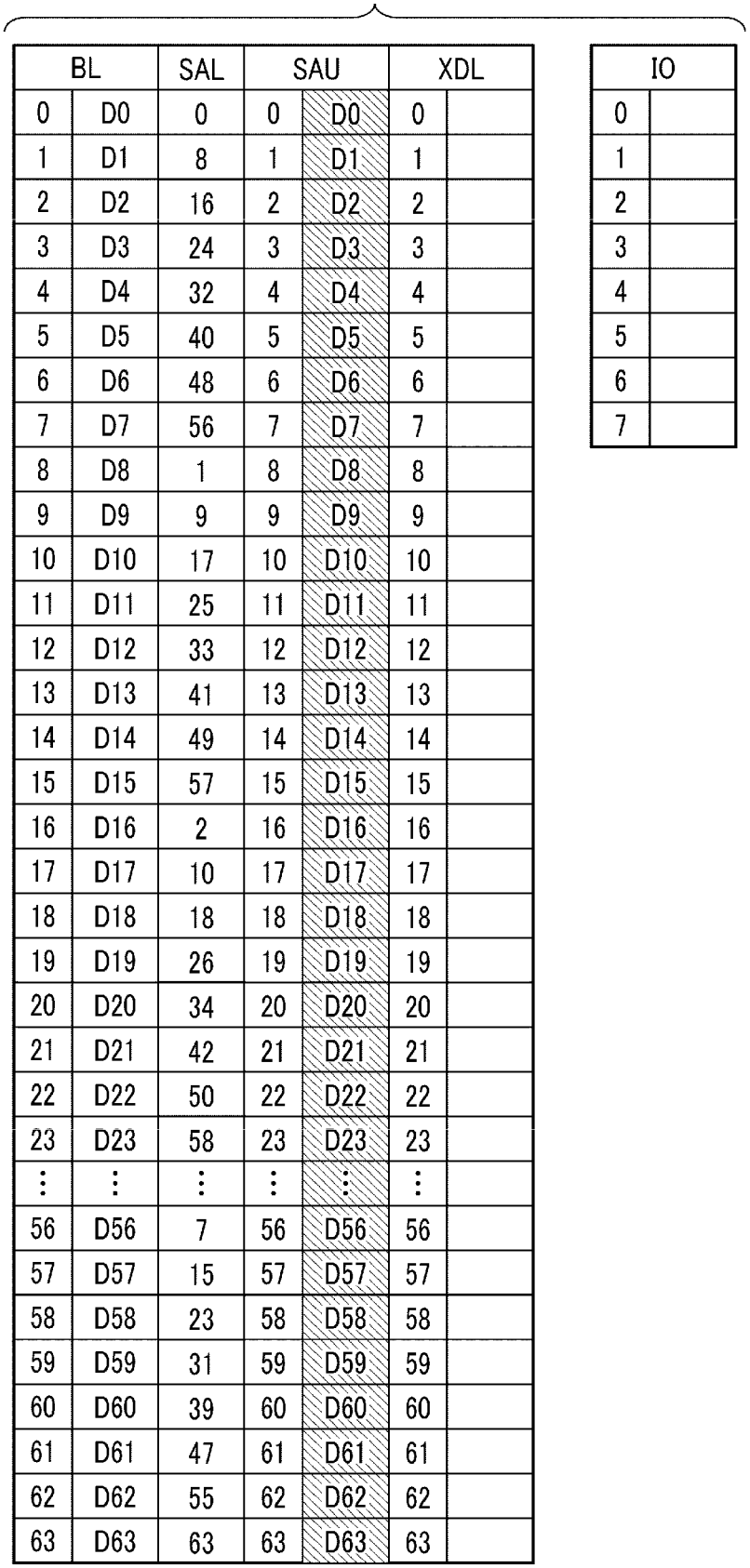

As illustrated in FIG. 13, when the second cell read command is received, the sequencer 15 starts the second cell reading by setting the ready/busy signal R/Bn and the internal busy signal to the "L" level. That is, the period tR2 and the period tR1 start. Based on the second cell read command, the sense amplifier units SAU0 to SAU63 read the data from the memory cell transistors MT via the corresponding bit lines BL0 to BL63. Hereinafter, the data corresponding to the bit lines BL0 to BL63 is notated as data D0 to D63.

Figure 14:
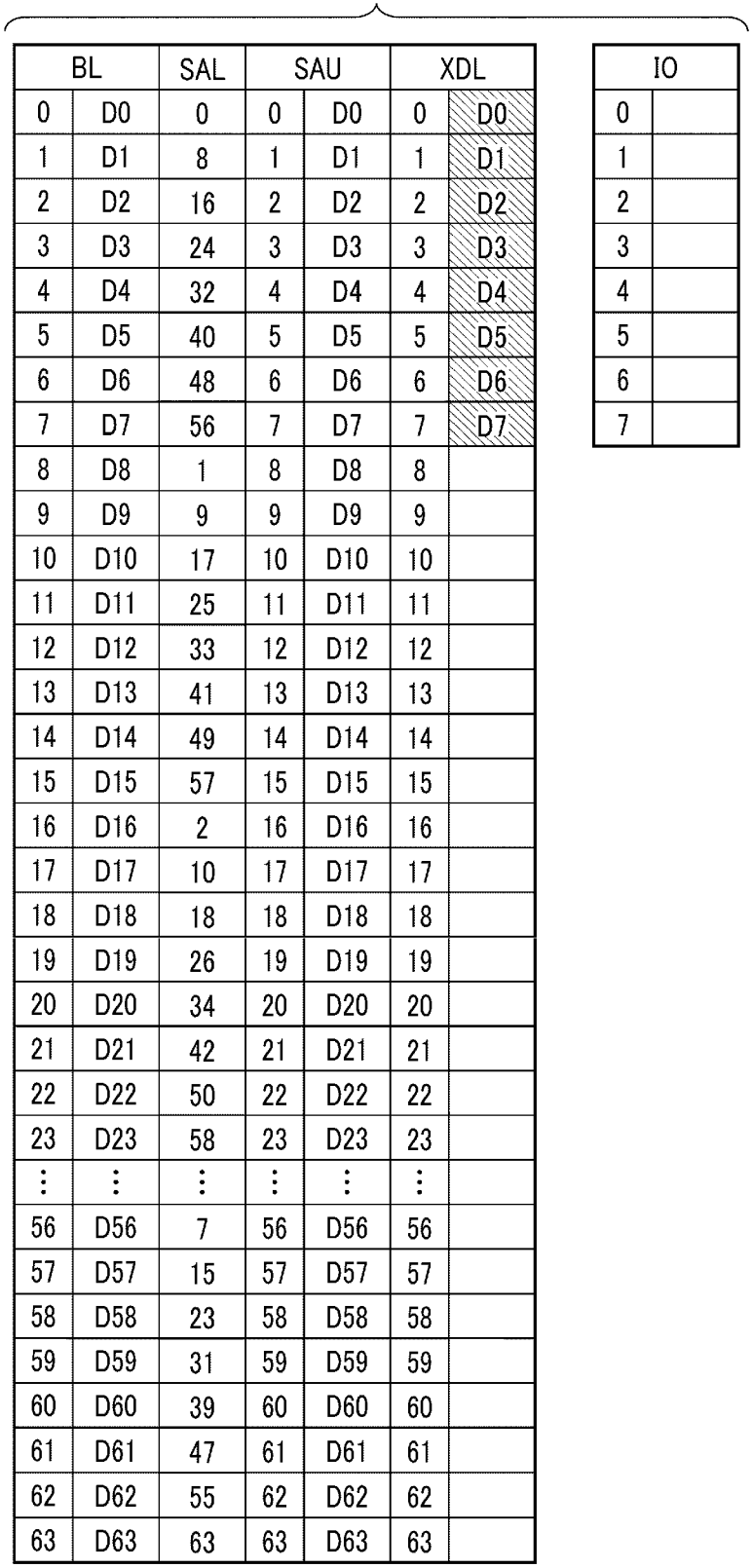

As illustrated in FIG. 14, subsequently, the sense amplifier 20 transmits the data D0 to D7 at the leading column through first data transmission to the latch circuits XDL. More specifically, the data D0 is transmitted from the sense amplifier unit SAU0 via the bus DBUS0 to the latch circuit XDL0. Similarly, the data D1 to D7 are transmitted from the sense amplifier units SAU1 to SAU7 via the buses DBUS1 to DBUS7 to the latch circuits XDL1 to XDL7. After the first data transmission ends, the ready/busy signal R/Bn is considered to be at the "H" level and the period tR2 ends. That is, during the period tR2, the data is read to the sense amplifier 20, as described in FIGS. 13 and 14 and the data at the leading column is transmitted from the sense amplifier 20 to the data register 21. When the controller 200 confirms that the ready/busy signal R/Bn returns to the "H" level, the controller 200 transmits the cache read command to the NAND flash memory 100.

As illustrated in FIG. 15, subsequently, the sequencer 15 outputs the data D0 to D7 at the leading column stored in the latch circuits XDL0 to XDL7 to the controller 200 via the data lines IO0 to IO7 based on a cache read command. The NAND flash memory 100 transmits the data from the sense amplifier 20 to the data register 21 concurrently with the process even while the cache read command is received and the data at the leading column is output. More specifically, the sense amplifier 20 continuously transmits the data to the latch circuit XDL from the first data transmission even while the data D0 to D7 at the leading column is output to the controller 200. For example, the data D8 to D39 at the second to fifth columns is transmitted to the latch circuits XDL8 to XDL39.

As illustrated in FIG. 16, the sequencer 15 continuously outputs the data D8 to D15 at the second column to the controller 200 via the data lines IO0 to IO7 based on the cache read command. Meanwhile, in the sense amplifier 20, for example, the data D40 to D63 at the sixth to eighth columns are transmitted to the latch circuits XDL40 to XDL63 and the transmission of the data from the sense amplifier 20 to the data register 21 ends. With the end of the transmission of the data, the internal busy signal is considered to be at the "H" level and the period tR1 ends. Accordingly, during the period t(R1-R2), the cache reading and the transmission of the data from the sense amplifier 20 to the data register 21 are executed concurrently.

Figure 17:
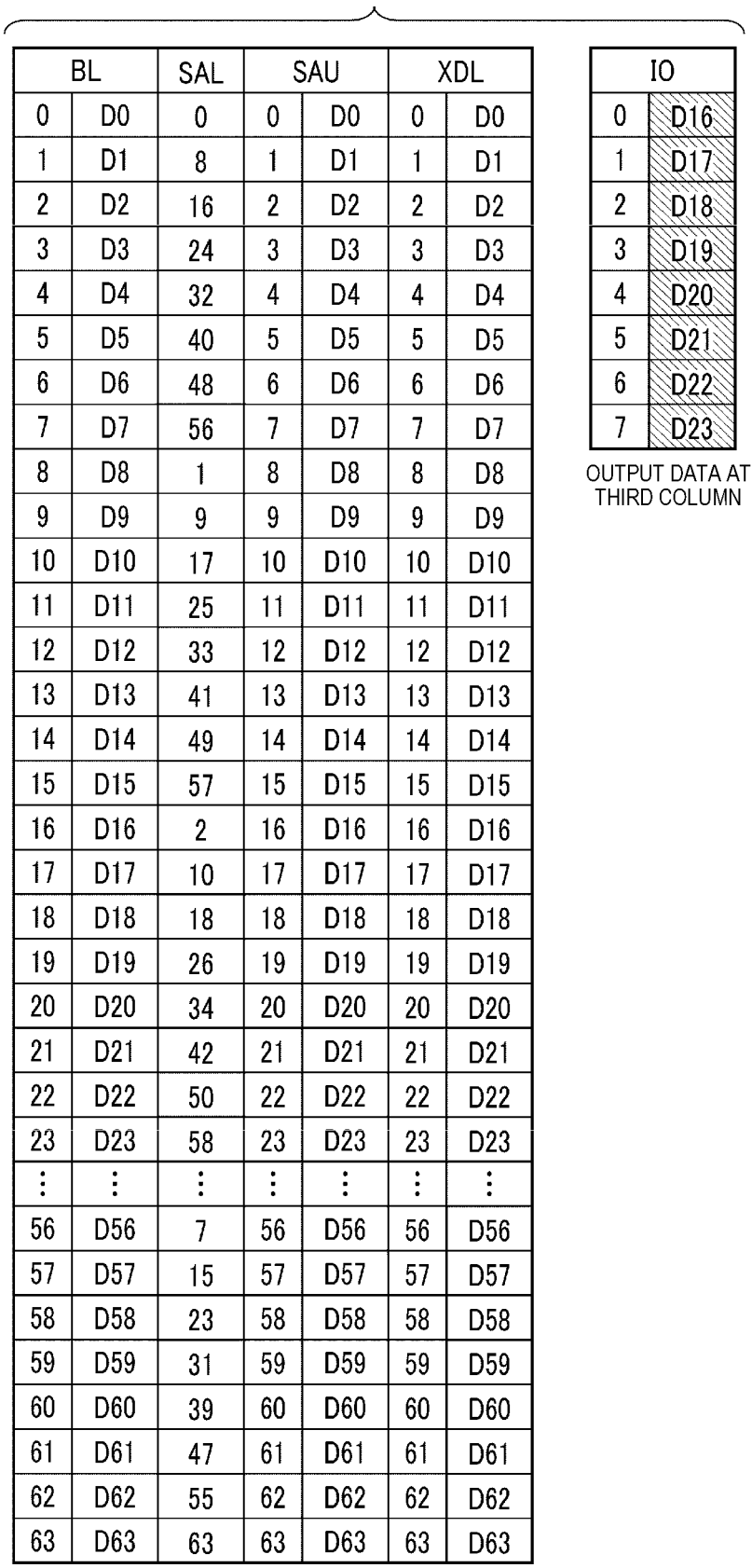

As illustrated in FIG. 17, even after the transmission of the data from the sense amplifier 20 to the data register 21 ends, the cache reading continues. For example, the data D16 to D23 at the third column is output to the controller 200 via the data lines IO0 to IO7. Thereafter, based on the cache read command, the other data stored in the data register 21 is also output to the controller 200.

1.4.2 Case of Transmission of Data Corresponding to Bit Lines BL0 to BL6399

Next, a case of transmission of data corresponding to bit lines BL0 to BL6399 will be described with reference to FIG. 18.

As illustrated in FIG. 18, latch circuits XDL0 to XDL6399 are installed to correspond to the bit lines BL0 to BL6399. Through first data transmission from the sense amplifier 20 to the data register 21, column data corresponding to columns 0 to 99 is transmitted to the latch circuits XDL0 to XDL7, XDL64 to XDL71, . . . , and XDL6336 to XDL 6343. After the first data transmission ends, the ready/busy signal R/Bn is considered to be at the "H" level and the NAND flash memory 100 receives the cache read command.

Based on a cache command, the sequencer 15 outputs the column data at columns 0 to 99 to the controller 200 via the data lines IO0 to IO7 in sequence. Concurrently with the outputting, the sense amplifier 20 executes the second and subsequent data transmissions to transmit the column data which is other columns to the data register 21. After outputting the column data corresponding to columns 0 to 99, the sequencer 15 outputs the column data at columns 100 to 799 to the controller 200 via the data lines IO0 to IO7 in sequence.

1.5 Advantages in Embodiment

In the configuration according to the embodiment, a processing capability can be improved. Hereinafter, the advantages will be described in detail.

For example, the period tR1 in which the transmission of the data from the memory cell array 18 to the data register 21 ends includes a read period in which the data is read from the memory cell array 18 to the sense amplifier 20 and a transmission period in which the data is transmitted from the sense amplifier 20 to the data register 21. For example, when the plurality of sense amplifier units SAU and the plurality of latch circuits XDL are connected to the common bus DBUS, the data is transmitted to the plurality of latch circuits XDL in serial (the data is transmitted a plurality of times). More specifically, for example, 8-bit data read from the memory cell array 18 via the 8 bit lines BL disposed in sequence is assumed to be equivalent to the column data. When the 8 sense amplifier units SAU connected to 8 bit lines BL disposed in sequence are connected to the 8 latch circuits XDL via one bus DBUS, it is necessary to transmit the data from the sense amplifier 20 to the data register 21 8 times in order for the data register 21 to output the data equivalent to one column.

In the configuration according to the embodiment, however, the plurality of bit lines BL disposed in sequence are connected to the sense amplifier lines SAL corresponding to the other data lines IO in the BL hookup circuit BHU. Accordingly, the data register 21 can receive the column data corresponding to the plurality of bit lines BL disposed in sequence from the sense amplifier 20 through data transmission performed once. Accordingly, it is possible to shorten the period in which the data register 21 enters a state in which the column data can be output.

Further, in the configuration according to the embodiment, the semiconductor storage device has two modes, the first cell reading and the second cell reading. Then, the controller 200 can select the second cell reading in the column address CA in which the cell reading and the cache reading are the same. In the case of the first cell reading, after the transmission of the data read from the sense amplifier 20 to the data register 21 ends, the ready/busy signal can be considered to be at the "H" level (the ready state) and the cache reading can be executed. On the other hand, in the case of the second cell reading, the sense amplifier 20 can transmit the column data at the leading column of the column address CA designated during the second cell reading in the first data transmission to the data register 21. When the transmission of the column data at the leading column ends, the semiconductor storage device can sets the ready/busy signal to the "H" level (the ready state). Even in a state in which the transmission of the data from the sense amplifier 20 to the data register 21 does not end, the semiconductor storage device can receive a cache read command and start outputting the data. For example, when the column data equivalent to 8 columns is read from the semiconductor storage device, the cache reading can be executed during the first cell reading after the column data equivalent to 8 columns is transmitted from the sense amplifier 20 to the data register 21 through the transmission of the data performed 8 times. On the other hand, during the second cell reading, the cache reading can be executed after the column data at the leading column is transmitted from the sense amplifier 20 to the data register 21 through the first data transmission. Then, during the second cell reading, the column data equivalent to the remaining 7 columns is transmitted from the sense amplifier 20 to the data register 21 concurrently with the cache reading. Accordingly, during the second cell reading, the cache read operation can be started earlier by the 7-times data transmission period. That is, the semiconductor storage device can shorten the period in which the cell read command is received and the cache read command is received.

Accordingly, the processing capability of the semiconductor storage device can be improved.

2. Second Embodiment

Next, a second embodiment will be described. In the second embodiment, a case in which there is no read command of cache reading will be described. Hereinafter, only differences from the first embodiment will be described.

2.1 Operation of Controller During First Cell Reading

First, an operation of the controller 200 during the first cell reading will be described with reference to FIG. 19.

Figure 19:
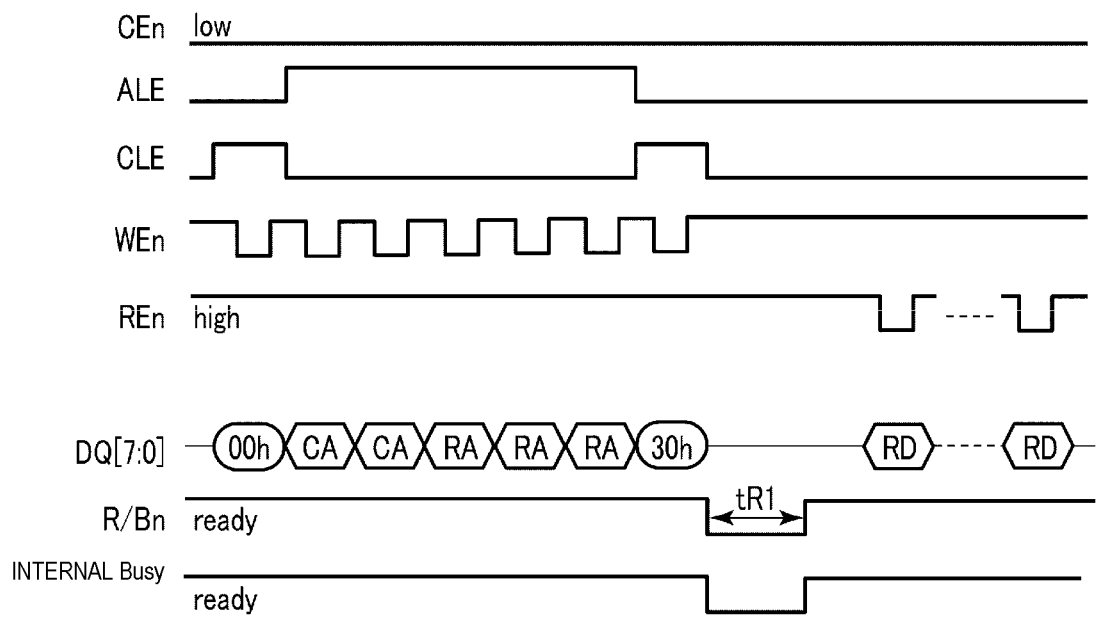
FIG. 19 is a timing chart illustrating various signals during first cell reading and cache reading in the memory system including the semiconductor storage device according to a second embodiment.

As illustrated in FIG. 19, the controller 200 transmits a first cell read command to the NAND flash memory 100 as in FIG. 10 of the first embodiment. More specifically, the controller 200 transmits the command "00h", the column address CA and the row address RA, and the first read command "30h" in this order.

The NAND flash memory 100 sets the ready/busy signal R/Bn and the internal busy signal to the "L" level during the period tR1 in which the cell reading starts and the transmission of the data to the data register 21 ends.

The controller 200 transmits a read enable signal REn with the "L" level after the ready/busy signal R/Bn enters the "H" level.

2.2 Operation of Controller During Second Cell Reading

Next, an operation of the controller 200 during the second cell reading will be described with reference to FIG. 20. Hereinafter, only differences from FIG. 19 will be described.

Figure 20:
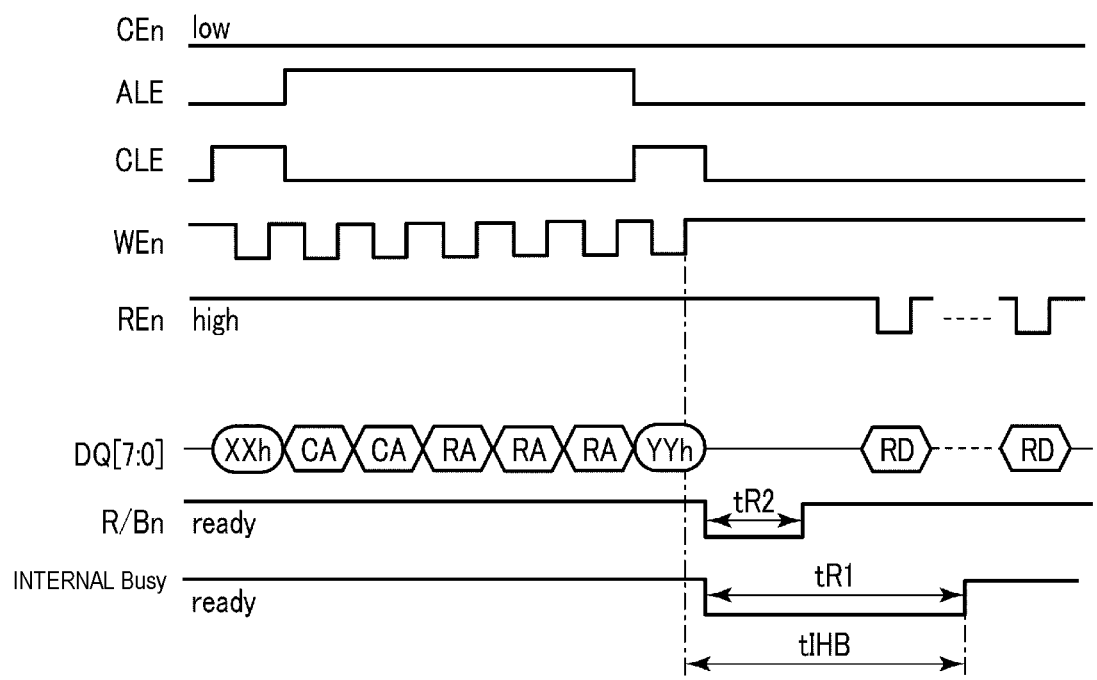
FIG. 20 is a timing chart illustrating various signals during second cell reading and cache reading in the memory system including the semiconductor storage device according to the second embodiment.

As illustrated in FIG. 20, the controller 200 transmits the second cell read command to the NAND flash memory 100 as in FIG. 11 of the first embodiment. More specifically, the controller 200 transmits the command "XXh", the column address CA and the row address RA, and the second cell read command "YYh" in this order.

The NAND flash memory 100 sets the ready/busy signal R/Bn to the "L" level during a period tR2 in which the cell reading starts and the transmission of the column data at the leading column to the data register 21 ends.

The controller 200 transmits the read enable signal REn with the "L" level after the ready/busy signal R/Bn enters the "H" level. The NAND flash memory 100 transmits the read data RD to the controller 200 based on the read enable signal REn.

2.3 Advantages According to the Second Embodiment

In the configuration according to the second embodiment, the same advantages as those of the first embodiment can be obtained.

3. Third Embodiment

Next, a third embodiment will be described. In the third embodiment, a case in which the ready/busy signal R/Bn is considered to be at the "H" level before transmission of data from the sense amplifier 20 to the data register 21 during the second cell reading will be described. Hereinafter, only differences from the first and second embodiments will be described.

3.1 Operation of Controller During Second Cell Reading

An operation of the controller 200 during the second cell reading will be described with reference to FIG. 21.

Figure 21:
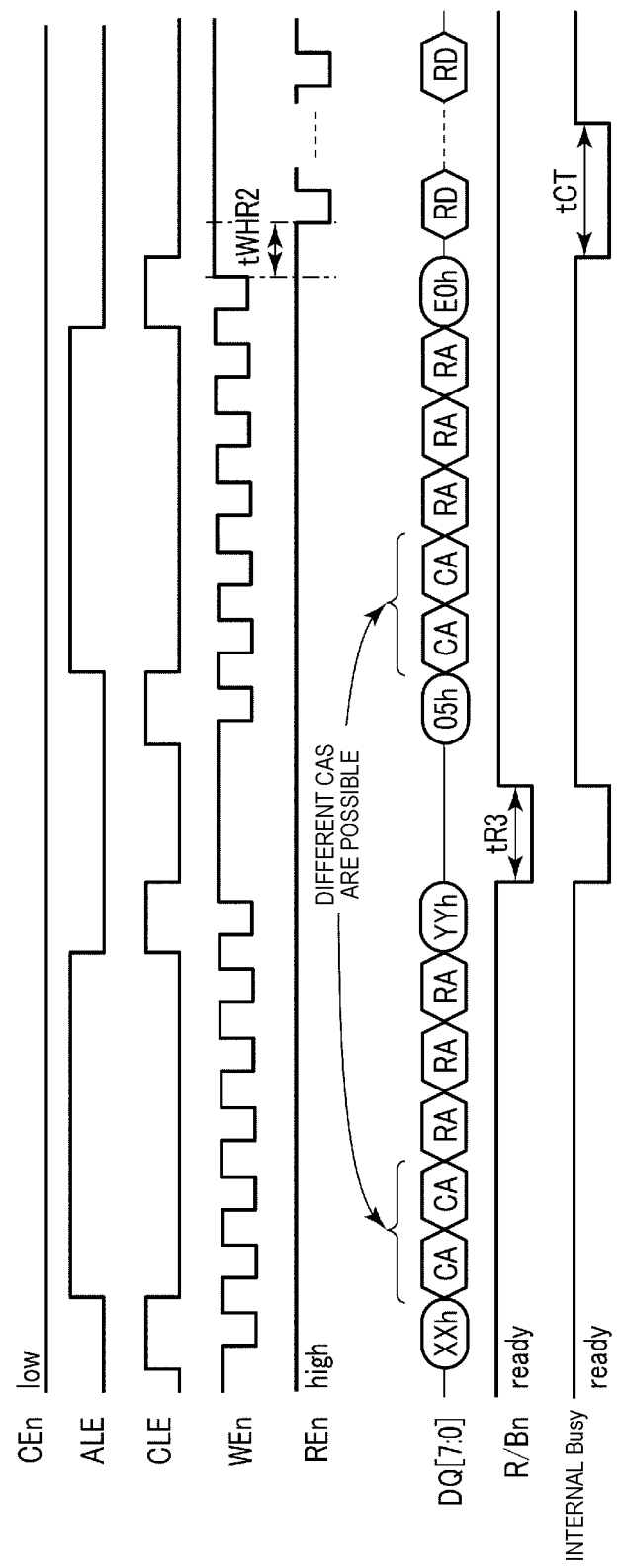
FIG. 21 is a timing chart illustrating various signals during second cell reading and cache reading in the memory system including the semiconductor storage device according to a third embodiment.

As illustrated in FIG. 21, the controller 200 transmits a second cell read command to the NAND flash memory 100 as in FIG. 11 of the first embodiment. More specifically, the controller 200 transmits the command "XXh", the column address CA and the row address RA, and a second cell read command "YYh" in this order.

The NAND flash memory 100 starts reading the data from the memory cell array 18 to the sense amplifier 20 according to the second cell read command "YYh". At this time, the ready/busy signal R/Bn and the internal busy signal are considered to be at the "L" level (the busy state) together. In the embodiment, transmission of the data from the sense amplifier 20 to the data register 21 is not executed during the second cell reading. When the reading of the data from the memory cell array 18 to the sense amplifier 20 ends, the NAND flash memory 100 sets the ready/busy signal R/Bn and the internal busy signal to the "H" level.

Hereinafter, a period in which the sense amplifier 20 starts reading the data and ends the reading is referred to as a "period tR3". Since the period tR3 does not include a period in which data is transmitted to the data register 21, the period tR3 is shorter than the period tR2.

When the controller 200 confirms that the ready/busy signal R/Bn returns to the "H" level (the ready state), the controller 200 transmits a cache read command to the NAND flash memory 100. More specifically, the controller 200 transmits the command "05h", the column address CA and the row address RA, and the cache read command "E0h" in this order.

In the embodiment, since the data is not transmitted from the sense amplifier 20 to the data register 21 at the time of ending the second cell reading, the column address CA of the cache reading may be different from the column address CA of the second cell reading.

The NAND flash memory 100 transmits the data from the sense amplifier 20 to the data register 21 (hereinafter this period is referred to as a "period tCT") based on the column address CA of the cache reading.

The controller 200 transmits the read enable signal REn with the "L" level after a waiting period tWHR2 elapses from rising of the write enable signal WEn corresponding to the second read command "YYh" from the "L" level to the "H" level. In this case, the waiting period tWHR2 is set to a period longer than a period in which the column data at the leading column of the column address CA designated in the cache reading is transmitted to the data register 21. For example, since the waiting period tWHR2 includes a transmission period of the column data, the waiting period tWHR2 is longer than the waiting period tWHR1 described in the first embodiment.

The NAND flash memory 100 transmits the read data RD to the controller 200 based on the read enable signal REn. Then, the NAND flash memory 100 transmits the data from the sense amplifier 20 to the data register 21 concurrently with the cache reading.

3.2 Advantages in According to the Third Embodiment

In the configuration according to the third embodiment, the same advantages as those of the first and second embodiments can be obtained.

Further, in the configuration according to the embodiment, the column address CA different from that of the second cell reading can be selected in the cache reading.

4. Modification Examples

The semiconductor storage device according to the foregoing embodiments includes: the memory cell array (18) that includes the first to sixth memory cells (MT); the first to third bit lines (BL0 to BL2) that are respectively connected to the first to third memory cells and are disposed in sequence in the first direction; the fourth to sixth bit lines (BL8 to BL10) that are respectively connected to the fourth to sixth memory cells and are disposed in sequence in the first direction; the sense amplifier that includes the first to sixth sense circuits (SAU0 to SAU2 and SAU8 to SAU10) respectively connected to the first to sixth bit lines and in which the first sense circuit (SAU0) and the fourth sense circuit (SAU8) are adjacent in a second direction, the second sense circuit (SAU1) and the fifth sense circuit (SAU9) are adjacent in the second direction, and the third sense circuit (SAU2) and the sixth sense circuit (SAU10) are adjacent in the second direction; the data register that includes the first to sixth latch circuits (XDL0 to XDL2 and XDL8 to XDL10) respectively connected to the first to sixth sense circuits and in which the first and fourth latch circuits (XDL0 and XDL8) are connected to the first and fourth sense circuits via the first bus (DBUS0), the second and fifth latch circuits (XDL1 and XDL9) are connected to the second and fifth sense circuits via the second bus (DBUS1), and the third and sixth latch circuits (XDL2 and XDL10) are connected to the third and sixth sense circuits via the third bus (DBUS2); and the input and output circuit (10) that is connected to the first and fourth latch circuits via the first data line (IO0), is connected to the second and fifth latch circuits via the second data line (IO1), and is connected to the third and sixth latch circuits via the third data line (IO2).

By applying the foregoing embodiments, it is possible to provide the semiconductor storage device capable of improving the processing capability.

Embodiments are not limited to the above-described embodiments, but may be modified in various forms.

For example, the foregoing embodiments can also be applied to a planar NAND flash memory in which memory cell transistors MT are disposed 2-dimensionally on a semiconductor substrate.

Further, the "connection" in the foregoing embodiments also includes indirect connection of portions made with another portion such as a transistor or a resistor interposed therebetween.

Further, the "adjacent" in the foregoing embodiments also includes a state in which an interlayer insulating film is interposed to be disposed between portions.

In each embodiment of the present disclosure, the following may be realized. For example, the memory cell transistor MT can retain 2-bit (4-value) data and threshold levels at the time of retaining any of 4 values are set to an Er level (erasure level), an A level, a B level, and a C level from the lower level.

(1) In a read operation, at this time, a voltage to be applied to a word line selected during the read operation with the A level is in a range of, for example, 0 V to 0.55 V. The voltage is not limited thereto, but may be in any of the ranges of 0.1 V to 0.24 V, 0.21 V to 0.31 V, 0.31 V to 0.4 V, 0.4 V to 0.5 V, and 0.5 V to 0.55 V.

A voltage to be applied to a word line selected in a read operation with the B level is in a range of, for example, 1.5 to 2.3 V. The voltage is not limited thereto, but may be in any of the ranges of 1.65 V to 1.8 V, 1.8 V to 1.95 V, 1.95 to 2.1 V, and 2.1 V to 2.3 V.

A voltage to be applied to a word line selected in a read operation with the C level is in a range of, for example, 3.0 to 4.0 V. The voltage is not limited thereto, but may be in any of the ranges of 3.0 V to 3.2 V, 3.2 V to 3.4 V, 3.4 to 3.5 V, 3.5 V to 3.6 V, and 3.6 V to 4.0 V.

A time (tR) of the read operation may be set between, for example, 25 µs to 38 µs, 38 µs to 70 µs, or 70 µs to 80 µs.

(2) A write operation includes a program operation and a verification operation, as described above. In the write operation, a voltage to be initially applied to a word line selected in the program operation is in a range of, for example, 13.7 V to 14.3 V. The voltage is not limited thereto, but may be in any of the ranges of, for example, 13.7 V to 14.0 V and 14.0 V to 14.6 V.

A voltage to be initially applied to a selected word line at the time of writing an odd word line and a voltage to be initially applied to a selected word line at the time of writing an even word line may be changed.

When the program operation is set to an incremental step pulse program (ISPP) scheme, about 0.5 V can be an example of a step-up voltage.

A voltage to be applied to a word line at the time of non-selection may be in a range of, for example, 6.0 V to 7.3 V. The voltage is not limited to this case, but may be in a range of, for example, 7.3 V to 8.4 V or may be 6.0 V or less.

A pass voltage to be applied may be changed according to whether a word line at the time of non-selection is an odd word line or an even word line.

A time (tProg) of the write operation may be in a range of, for example, 1700 µs to 1800 µs, 1800 µs to 1900 µs, or 1900 µs to 2000 µs.

(3) In an erasing operation, a voltage to be initially applied to a well formed in an upper portion of a semiconductor substrate and disposed above the memory cell is in a range of, for example, 12 V to 13.6 V. The voltage is not limited to this case, but may be in a range of, for example, 13.6 V to 14.8 V, 14.8 V to 19.0 V, 19.0 V to 19.8 V, or 19.8 V to 21 V.

A time (tErase) of the erasing operation may be in a range of, for example, 3000 µs to 4000 µs, 4000 µs to 5000 µs, or 4000 µs to 9000 µs.

(4) A structure of a memory cell in a planar NAND flash memory has a charge storage layer disposed via a tunnel insulating film with a film thickness of 4 to 10 nm on a semiconductor substrate (silicon substrate). The charge storage layer may have a stacked structure of an insulating film such as SiN or SiON with a film thickness of 2 to 3 nm and polysilicon with a film thickness of 3 to 8 nm. Metal such as Ru may be added to the polysilicon. An insulating film is formed above the charge storage layer. This insulating film includes a silicon oxide film with a film thickness of 4 to 10 nm interposed between a lower-layer High-k film with a film thickness of 3 to 10 nm and an upper-layer High-k film with a film thickness of 3 to 10 nm. HfO can be an example of the High-k film. The film thickness of the silicon oxide film can be set to be thicker than the film thickness of the High-k film. Above the insulating film, a control electrode with a film thickness of 30 nm to 70 nm is formed via a material with a film thickness of 3 to 10 nm. Such material is a metal oxide film such as TaO or a metal nitride film such as TaN. W or the like can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell array that includes first to sixth memory cells;
   a first group of adjacent bit lines including first to third bit lines that are respectively connected to the first to third memory cells and are disposed in sequence in a first direction;

a second group of adjacent bit lines including fourth to sixth bit lines that are respectively connected to the fourth to sixth memory cells and are disposed in sequence in the first direction;

a sense amplifier that includes first to sixth sense circuits respectively connected to the first to sixth bit lines and in which the first and fourth sense circuits are arranged along a second direction perpendicular to the first direction and connected to a first data bus, the second and fifth sense circuits are arranged along the second direction and connected to a second data bus, and the third and sixth sense circuits are arranged along the second direction and connected to a third data bus, wherein the first, second, and third sense circuits are aligned along the first direction and the fourth, fifth, and sixth sense circuits are also aligned along the first direction;

a hookup circuit electrically connected between the memory cell array and the sense amplifier and including first to six contacts arranged along a line that is parallel to the first direction and through which the first, fourth, second, fifth, third, and sixth bit lines are connected to the respective sense circuits, a data register that includes first to sixth latch circuits respectively connected to the first to sixth sense circuits and in which the first and fourth latch circuits are connected to the first and fourth sense circuits via the first bus, the second and fifth latch circuits are connected to the second and fifth sense circuits via the second bus, and the third and sixth latch circuits are connected to the third and sixth sense circuits via the third bus; and an input and output circuit that is connected to the first and fourth latch circuits via a first data line, is connected to the second and fifth latch circuits via a second data line, and is connected to the third and sixth latch circuits via a third data line.

2. The semiconductor storage device according to claim 1, wherein the first and fourth sense circuits are adjacent in the second direction, the second and fifth sense circuits are adjacent in the second direction, and the third and sixth sense circuits are adjacent in the second direction.

3. The semiconductor storage device according to claim 1, further comprising:
a control circuit configured to perform a first read operation to read data from the memory cell array to the data register in response to a first command and a second read operation to output the data from the data register through the input and output circuit in response to a second command.

4. The semiconductor storage device according to claim 3, wherein the second read operation is carried out prior to completion of the first read operation.

5. The semiconductor storage device according to claim 4, wherein the first command follows an input of a first column address and the second command follows an input of a second column address that is the same as the first column address.

6. The semiconductor storage device according to claim 3, wherein the second read operation is carried out after completion of the first read operation.

7. The semiconductor storage device according to claim 1, further comprising:
a control circuit configured to perform a read operation to read data from the memory cell array to the data register and to output the data from the data register through the input and output circuit in response to a single command.

8. The semiconductor storage device according to claim 1, further comprising:
a control circuit configured to perform a first read operation to read data from the memory cell array to the sense amplifier in response to a first command, and a second read operation to read the data from the sense amplifier to the data register and output the data from the data register through the input and output circuit in response to a second command.

9. The semiconductor storage device according to claim 8, wherein the first command follows an input of a first column address and the second command follows an input of a second column address that is different from the first column address.

10. The semiconductor storage device according to claim 1, wherein
the first sense circuit is arranged farther away from the hookup circuit than the fourth sense circuit.

11. The semiconductor storage device according to claim 10, wherein
the first latch circuit is arranged farther away from the hookup circuit than the fourth sense circuit.

12. The semiconductor storage device according to claim 10, wherein
a first distance between the hookup circuit and each of the first, second, and third sense circuits is identical.

13. The semiconductor storage device according to claim 12, wherein
a second distance between the hookup circuit and each of the fourth, fifth, and sixth sense circuits is identical.

* * * * *